United States Patent
Nakauchi et al.

(12) 
(10) Patent No.: US 9,515,200 B2
(45) Date of Patent: Dec. 6, 2016

(54) PHOTOVOLTAIC MODULE

(75) Inventors: Atsushi Nakauchi, Kaizuka (JP);
Shingo Okamoto, Toyonaka (JP);
Toshio Yagiura, Kobe (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 960 days.

(21) Appl. No.: 11/657,131

(22) Filed: Jan. 24, 2007

(65) Prior Publication Data

US 2007/0186968 A1 Aug. 16, 2007

(30) Foreign Application Priority Data

Jan. 24, 2006 (JP) ................................ 2006-014917

(51) Int. Cl.
| | |
|---|---|
| H01L 31/00 | (2006.01) |
| H01L 31/02 | (2006.01) |
| H01L 31/0224 | (2006.01) |
| H01L 31/0747 | (2012.01) |
| H01L 31/05 | (2014.01) |

(52) U.S. Cl.
CPC ... *H01L 31/0201* (2013.01); *H01L 31/022425* (2013.01); *H01L 31/022433* (2013.01); *H01L 31/0504* (2013.01); *H01L 31/0747* (2013.01); *Y02E 10/50* (2013.01)

(58) Field of Classification Search
CPC .............. H01L 31/022425; H01L 31/022433; H01L 31/0747; H01L 31/0504; H01L 31/0201; H01L 31/05; Y02E 10/50
USPC ........................................ 136/243, 244, 256
See application file for complete search history.

(56) References Cited

U.S. PATENT DOCUMENTS

| | | | |
|---|---|---|---|
| 4,697,041 A | | 9/1987 | Okinawa et al. |
| 5,389,159 A | | 2/1995 | Kataoka et al. |
| 5,474,620 A | * | 12/1995 | Nath ..................... H01L 31/048 136/251 |
| 5,759,291 A | | 6/1998 | Ichinose et al. |
| 6,113,718 A | * | 9/2000 | Yamada et al. ................. 156/78 |

(Continued)

FOREIGN PATENT DOCUMENTS

| | | |
|---|---|---|
| DE | 90 04 602 U1 | 9/1990 |
| EP | 0751575 A2 | 1/1997 |

(Continued)

OTHER PUBLICATIONS

Burgers, "How to Design optimal matallization patterns for solar cells", Progress in Photovoltaics, 1999.*

(Continued)

*Primary Examiner* — Matthew Martin
(74) *Attorney, Agent, or Firm* — McDermott Will & Emery LLP

(57) ABSTRACT

A photovoltaic module capable of suppressing separation of a tab electrode can be obtained. The photovoltaic module includes a plurality of semiconductor layers including a photoelectric conversion layer, a plurality of photovoltaic elements including a finger electrode for collecting generated currents, formed on the semiconductor layers on a side of a light receiving surface, and a tab electrode for electrically connecting the plurality of photovoltaic elements, in which the tab electrode is electrically connected to the finger electrode in a region corresponding to a power generation region of the photovoltaic element and bonded on the light receiving surface through an insulating bonding material.

29 Claims, 10 Drawing Sheets

(56) References Cited

U.S. PATENT DOCUMENTS

| | | | |
|---|---|---|---|
| 6,326,280 B1* | 12/2001 | Tayanaka | 438/409 |
| 6,384,317 B1 | 5/2002 | Kerschaver et al. | |
| 6,388,187 B1 | 5/2002 | Takeyama et al. | |
| 6,573,445 B1 | 6/2003 | Burgers | |
| 6,706,961 B2* | 3/2004 | Shimizu et al. | 136/256 |
| 6,806,414 B2* | 10/2004 | Shiotsuka et al. | 136/256 |
| 2001/0021547 A1 | 9/2001 | Sakairi | |
| 2003/0005955 A1 | 1/2003 | Shiotsuka et al. | |
| 2004/0200522 A1 | 10/2004 | Fukawa et al. | |
| 2005/0115602 A1* | 6/2005 | Senta et al. | 136/250 |
| 2005/0199279 A1 | 9/2005 | Yoshimine et al. | |
| 2008/0023069 A1 | 1/2008 | Terada et al. | |
| 2009/0277491 A1 | 11/2009 | Nakamura et al. | |

FOREIGN PATENT DOCUMENTS

| | | |
|---|---|---|
| JP | 58-101453 A | 6/1983 |
| JP | 6-196743 A | 7/1994 |
| JP | 09-018034 A | 1/1997 |
| JP | 09116719 | 2/1997 |
| JP | 09116175 | 5/1997 |
| JP | 10-65192 A | 3/1998 |
| JP | 11-243224 A | 9/1999 |
| JP | 2000-150948 | 5/2000 |
| JP | 2000-261012 A | 9/2000 |
| JP | 2002500825 A | 1/2002 |
| JP | 2003-258277 A | 9/2003 |
| JP | 2004-095674 A | 3/2004 |
| JP | 2005-268254 | 9/2005 |
| WO | WO 00/31803 | 6/2000 |
| WO | WO 2005053039 A2 * | 6/2005 |
| WO | 2007-043428 A1 | 4/2007 |

OTHER PUBLICATIONS

Chinese Office Action, w/ English translation thereof, issued in Chinese Patent Application No. CN 2007100043543 dated Mar. 13, 2009.
European Search Report issued in European Patent Application No. EP 07 25 0258, dated Oct. 6, 2009.
United States Office Action issued in U.S. Appl. No. 13/302,838 dated Aug. 16, 2012.
Office Action for U.S. Appl. No. 13/302,838 dated Apr. 2, 2013.
Chinese Office Action issued in Chinese Application No. 201110358112.0 dated Mar. 27, 2014, w/Partial English translation.
Chinese Office Action issued in CHinese Application No. 201110358112.0 dated Aug. 29, 2013, w/Partial English translation.
Japanese Office Action issued in Japanese Application No. 2010-220766 dated Mar. 19, 2013.
European Search Report issued in European Application No. 11182123.7-1508 dated Feb. 18, 2014.
U.S. Office Action issued in U.S. Appl. No. 13/846,883 dated Apr. 11, 2014.
U.S. Office Action mailed in U.S. Appl. No. 13/302,838 on Oct. 16, 2013; 20 pages.
U.S. Office Action mailed in U.S. Appl. No. 13/302,838 on May 15, 2014; 20 pages.
U.S. Office Action mailed in U.S. Appl. No. 13/302,838 on Sep. 26, 2014; 21 pages.
U.S. Office Action mailed in U.S. Appl. No. 13/846,883 on Dec. 3, 2014; 13 pages.
U.S. Office Action mailed in U.S. Appl. No. 13/846,883 on Mar. 26, 2015; 12 pages.
Japanese Office Action, and English translation thereof, issued in Japanese Patent Application No. 2011-213305 mailed Dec. 4, 2012; 7 pages with English translation.
Japanese Written Amendment, and English translation thereof, issued in Japanese Patent Application No. 2011-213305 mailed Nov. 8, 2012; 5 pages with English translation.
Japanese Office Action, and English translation thereof, issued in Japanese Patent Application No. 2010-220766 mailed Sep. 4, 2012; 12 pages with English translation.
Japanese Office Action, and English translation thereof, issued in Japanese Patent Application No. 2011-213305 mailed Sep. 11, 2012.
U.S. Office Action issued in U.S. Appl. No. 13/302,838, mailed on Jun. 10, 2015.
U.S. Office Action issued in U.S. Appl. No. 13/846,883, mailed on Aug. 19, 2015.
U.S. Office Action dated Dec. 3, 2015, in U.S. Appl. No. 13/846,883.
Final Office Action U.S. Appl. No. 13/846,883 dated May 26, 2016.

* cited by examiner 300-300

FIG.9
FIG.10
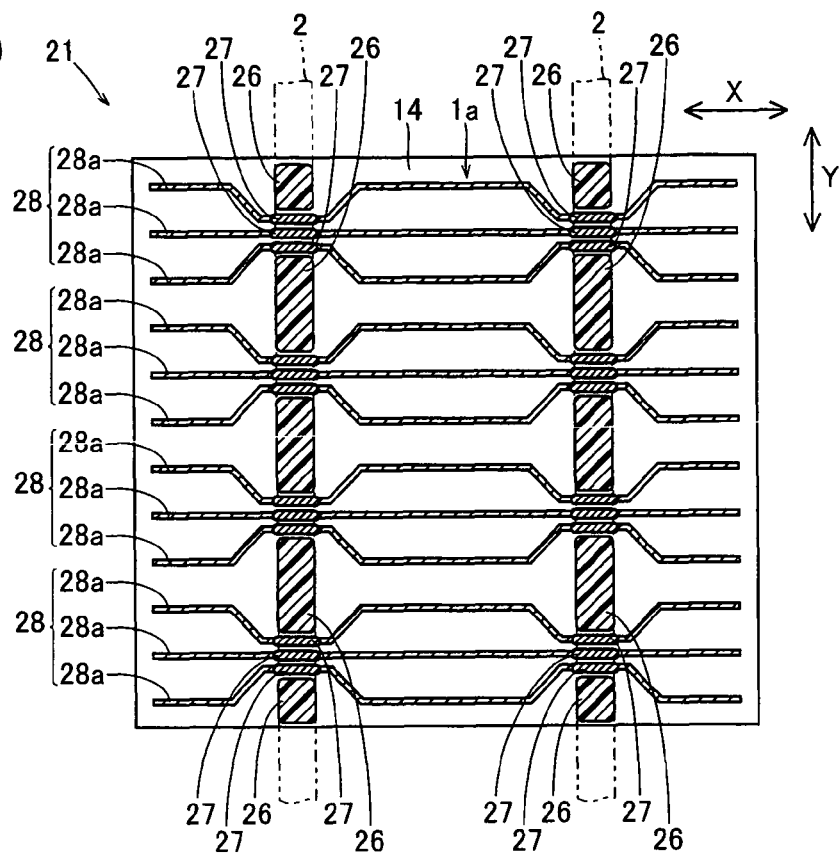
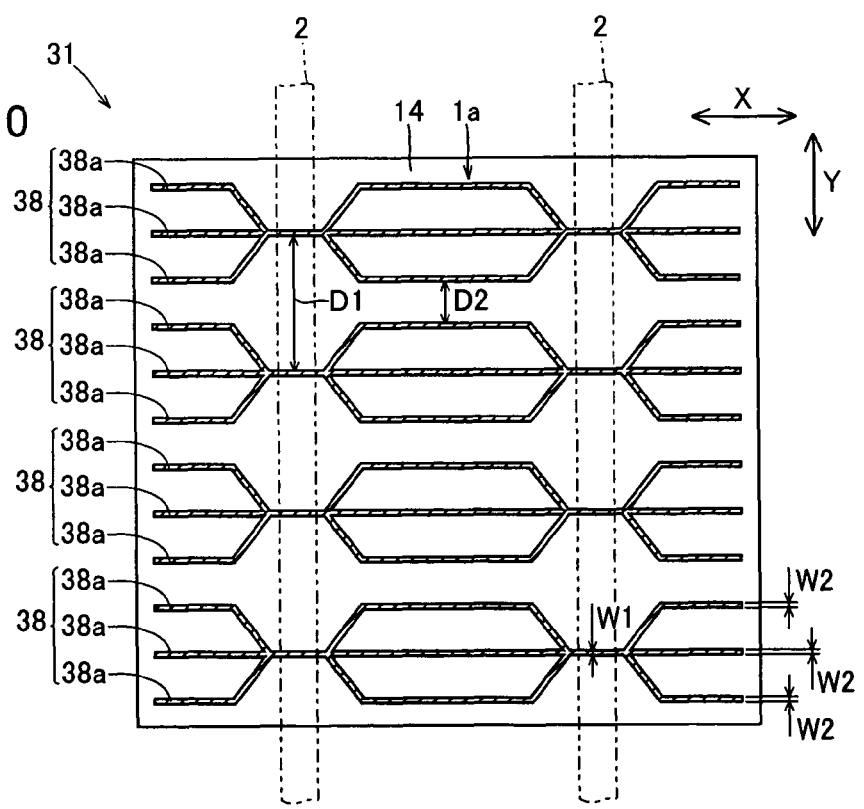

PHOTOVOLTAIC MODULE

BACKGROUND OF THE INVENTION

Field of the Invention

The present invention relates to a photovoltaic module, and more particularly, it relates to a photovoltaic module including a plurality of photovoltaic elements.

Description of the Background Art

A photovoltaic module in which a plurality of photovoltaic elements are serially connected with each other is known in general, as disclosed in Japanese Patent Laying-Open No 10-65192 (1998), for example.

Each photovoltaic element constituting the conventional photovoltaic module disclosed in the aforementioned Japanese Patent Laying-Open No 10-65192 includes a finger electrode consisting of a metallic wire for collecting generated currents, bonded to a element surface through a conductive adhesive, and a bus bar electrode consisting of foil or a metallic wire for aggregating currents collected by the finger electrode consisting of a metallic wire. The bus bar electrode of the conventional photovoltaic element is so bonded to a surface of a non-light emitting region other than a light emitting region of the photovoltaic element as to be electrically connected to the finger electrode.

In the photovoltaic module disclosed in the aforementioned Japanese Patent Laying-Open No 10-65192, the metallic wire is employed as the finger electrode, and hence the conductive adhesive for bonding the finger electrode and the element surface must be disadvantageously provided independently of the finger electrode.

On the other hand, a photovoltaic element in which a finger electrode and a bus bar electrode are formed of conductive paste has been proposed in general. In a case where a photovoltaic module is formed from the conventional photovoltaic elements, a tab electrode consisting of foil is bonded on the bus bar electrode formed of the conductive paste of the photovoltaic elements adjacent to each other by soldering, whereby the photovoltaic elements are serially connected with each other. In a case where this finger electrode formed of the conductive paste is employed, the conductive paste has an adhesion function, and hence an adhesive for bonding the finger electrode and the element surface is not required to be provided dissimilarly to a case where the finger electrode consisting of the metallic wire is employed.

In the aforementioned conventional photovoltaic module in which the finger electrode and the bus bar electrode are formed of the conductive paste and the tab electrode consisting of foil is formed on the bus bar electrode, however, in a case where an excessive tensile stress is applied to the bus bar electrode through the tab electrode, the bus bar electrode is likely to be separated from a surface of the photovoltaic element.

SUMMARY OF THE INVENTION

The present invention has been proposed in order to solve the aforementioned problem, and an object of the present invention is to provide a photovoltaic module capable of suppressing separation of a tab electrode.

In order to attain the aforementioned object, a photovoltaic module according to an aspect of the present invention comprises a plurality of photovoltaic elements each including a plurality of semiconductor layers including a photoelectric conversion layer and a finger electrode for collecting generated currents, formed on the semiconductor layers on a side of a light receiving surface and a tab electrode for electrically connecting the plurality of photovoltaic elements. The tab electrode is electrically connected to the finger electrode and bonded on the light receiving surface through an insulating bonding material in a region corresponding to a power generation region of the photovoltaic element.

In the photovoltaic module according to this aspect, as hereinabove described, the tab electrode is directly bonded on the light receiving surface through the insulating bonding material in the region corresponding to the power generation region of the photovoltaic element, whereby a bonding strength between the element and the tab electrode can be increased as compared with a bonding strength between the element and the tab electrode (bus bar electrode) in a case where the tab electrode is bonded on the light receiving surface through the bus bar electrode formed of conductive paste having no strong bonding force. Thus, separation of the tab electrode from the element can be suppressed. Consequently, also in a case where the finger electrode (collector) forming of conductive paste is included, the separation of the tab electrode can be suppressed. The tab electrode is bonded on the light receiving surface without the bus bar electrode, whereby the bus bar electrode can be omitted. Thus, an electrode structure can be simplified. In the region corresponding to the power generation region of the photovoltaic element, the tab electrode is bonded on the light receiving surface through the insulating bonding material, whereby a dark current can be inhibited from flowing through the bonding material dissimilarly to a case where the tab electrode is bonded on the light receiving surface through conductive bonding material. Thus, reduction in a characteristic of the photovoltaic module can be suppressed.

In the photovoltaic module according to the aforementioned aspect, the insulating bonding material is preferably provided in a region corresponding to the power generation region of the photovoltaic element, in which the finger electrode is not formed. According to this structure, the element and the tab electrode can be bonded through the insulating bonding material in the region in which the finger electrode is not formed, whereby the tab electrode and the finger electrode can be easily electrically connected to each other by a solder or the like.

In the photovoltaic module according to the aforementioned aspect, a plurality of the finger electrodes are preferably so formed as to extend in a first direction and be spaced from each other at a prescribed interval in a second direction intersecting with the first direction, the tab electrode is preferably so arranged as to extend in the second direction, and the insulating bonding material is preferably provided in a region in which the tab electrode is arranged and the finger electrode is not formed. According to this structure, the element and the tab electrode can be bonded through the insulating bonding material in the region in which the tab electrode is arranged without preventing electrical connection of the tab electrode and the finger electrode.

In the aforementioned structure in which a plurality of the finger electrodes are formed to be spaced from each other at a prescribed interval in the second direction, the insulating bonding materials may be provided in a plurality of regions located between the finger electrodes adjacent in the second direction, in which the tab electrode is arranged. According to this structure, a bonding region of the element and the tab electrode can be increased in the region in which the tab electrode is arranged without preventing electrical connection of the tab electrode and the finger electrode.

In the aforementioned structure in which a plurality of the finger electrodes are formed to be spaced from each other at a prescribed interval in the second direction, the plurality of finger electrodes may be divided into a plurality of groups each including a prescribed number of the finger electrodes, the prescribed number of the finger electrodes included in the same group may be so formed that a distance in the second direction between the finger electrodes adjacent in a region in which the tab electrode is arranged is smaller than a distance in the second direction between the finger electrodes adjacent in a region in which the tab electrode is not arranged, and the insulating bonding materials may be provided in a plurality of regions located between the groups adjacent in the second direction, in which the tab electrode is arranged. According to this structure, the distance in the second direction between the adjacent finger electrodes is increased in the region in which the tab electrode is arranged, whereby an area of a region to which the insulating bonding material arranged between the adjacent finger electrodes is applied can be increased. Thus, application of the insulating bonding material to the light receiving surface can be easily performed.

In the aforementioned structure in which a plurality of the finger electrodes are formed to be spaced from each other at a prescribed interval in the second direction, the plurality of finger electrodes may be divided into a plurality of groups each including a prescribed number of the finger electrodes, the prescribed number of the finger electrodes included in the same group may be aggregated into one finger electrode of the prescribed number of the finger electrodes in a region in which the tab electrode is arranged, and the insulating bonding materials may be provided in a plurality of regions located in the groups adjacent in the second direction, in which the tab electrode is arranged. According to this structure, an area of a region in which the finger electrode is not formed can be increased in the region in which tab electrode is arranged, whereby an area of a bonding region of the element and the tab electrode can be increased. Thus, a bonding strength between the element and the tab electrode can be increased.

In this case, an interval between the aggregated finger electrodes of two of the groups adjacent to each other is preferably larger than a distance between the finger electrodes opposed to each other of two of the groups adjacent to each other. According to this structure, an area of a region in which the finger electrode is not formed can be increased in the region in which tab electrode is arranged, whereby an area of a bonding region of the element and the tab electrode can be increased.

In the aforementioned structure in which the prescribed number of the finger electrodes included in the same group may be aggregated into one finger electrode, a width in the second direction of the aggregated finger electrode is preferably substantially equal to a width in the second direction of each of the finger electrodes located in regions in which the tab electrode is not arranged. According to this structure, it is possible to suppress increase in an area occupied by the aggregated finger electrode in the region in which the tab electrode is arranged. Thus, an area of a region in which the finger electrode is not formed can be increased in the region in which tab electrode is arranged, whereby an area of a bonding region of the element and the tab electrode can be increased.

In the aforementioned structure in which the prescribed number of the finger electrodes included in the same group may be aggregated into one finger electrode, a width in the second direction of the aggregated finger electrode located in the region in which the tab electrode is arranged is preferably larger than a width in the second direction of each of the finger electrodes located in regions in which the tab electrode is not arranged. According to this structure, a contact area of the tab electrode and the finger electrode can be increased in the region in which the tab electrode is arranged, whereby contact resistance between the tab electrode and the finger electrode can be reduced.

In this case, a width in the second direction of the aggregated finger electrode is preferably smaller than a distance in the second direction between two of the finger electrodes located at outermost positions in the group in a region in which the tab electrode is not arranged. According to this structure, an area of a region in which the finger electrode is not formed can be increased in the region in which tab electrode is arranged, whereby an area of a bonding region of the element and the tab electrode can be increased.

In the photovoltaic module according to the aforementioned aspect, the tab electrode is preferably electrically connected to the finger electrode through a solder material. According to this structure, the tab electrode and the finger electrode can be easily electrically connected to each other by the solder material.

In this case, the solder materials are provided over substantially entire regions in which the finger electrode and the tab electrode are overlapped in plan view. According to this structure, an area of an electrical connection portion of the finger electrode and the tab electrode can be increased. Thus, the finger electrode and the tab electrode can be inhibited from being electrically disconnected to each other, and resistance of a connection portion of the finger electrode and the tab electrode can be reduced.

In the aforementioned structure in which the tab electrode is electrically connected to the finger electrode through the solder material, the solder material and the insulating bonding material are preferably so provided as to be spaced at a prescribed interval. According to this structure, the insulating bonding material can be inhibited from protruding into the region in which the solder material is provided. Thus, normal electrical connection of the finger electrode and the tab electrode by the solder material can be inhibited from being hindered due to the protruding bonding material.

In the aforementioned structure in which the tab electrode is electrically connected to the finger electrode through the solder material, the finger electrode is preferably so formed as to extend in a first direction, the tab electrode is preferably so arranged as to extend in a second direction intersecting with the first direction, and the finger electrode is preferably divided in a region in which the tab electrode is arranged so as not to cross the region in which the tab electrode is arranged. According to this structure, the finger electrode is not formed in the region in which the tab electrode is arranged, whereby the insulating bonding material can be so provided as to extend continuously along the second direction. Thus, an area of a bonding region of the element and the tab electrode can be further increased, whereby a bonding strength between the element and the tab electrode can be further increased.

In the aforementioned structure in which the tab electrode is so arranged as to extend in the second direction, the insulating bonding material is preferably so provided in the region in which the tab electrode is arranged as to extend continuously along the second direction. According to this structure, an area of a bonding region of the element and the tab electrode can be easily further increased.

In the aforementioned structure in which the insulating bonding material is so provided as to extend continuously along the second direction, the solder material is preferably so provided in portions of side surfaces in the first direction of the tab electrode and the insulating bonding material as to electrically connect the side surface of the tab electrode and an divided end of the finger electrode. According to this structure, even if the finger electrode is divided in the region in which the tab electrode is arranged, the tab electrode and the finger electrode can be easily electrically connected to each other through the solder material.

In this case, the solder materials are preferably so provided in portions of both side surfaces in the first direction of the tab electrode and the insulating bonding material as to electrically connect both side surfaces of the tab electrode and both divided ends of the finger electrode. According to this structure, an area of an electrical connection portion of the finger electrode and the tab electrode can be increased. Thus, normal electrical connection of the finger electrode and the tab electrode by the solder material can be inhibited from being hindered, and resistance of a connection portion of the finger electrode and the tab electrode can be reduced.

In the photovoltaic module according to the aforementioned aspect, the photovoltaic element preferably includes a translucent conductive film formed closer to the light receiving surface than the semiconductor layer, and the tab electrode is preferably bonded to the translucent conductive film through the insulating bonding material. According to this structure, the photovoltaic element and the tab electrode can be easily bonded to each other.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a plan view showing the photovoltaic element constituting the photovoltaic module according to the first modification of the first embodiment, from which the tab electrodes are removed;

FIG. 10 is a plan view showing configuration of finger electrodes of a photovoltaic element constituting a photovoltaic module according to a second modification of the first embodiment;

DESCRIPTION OF THE PREFERRED EMBODIMENTS

Embodiments of the present invention will be hereinafter described with reference to the drawings.

First Embodiment

A structure of a photovoltaic module according to a first embodiment will be now described with reference to FIGS. 1 to 7.

Figure 1:
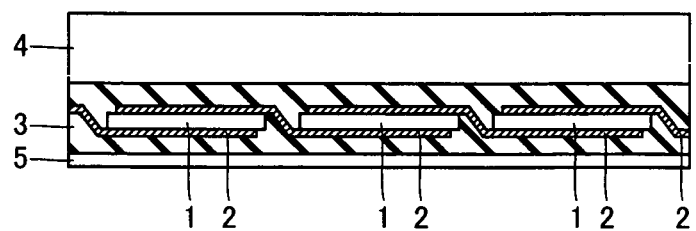
FIG. 1 is a sectional view showing a structure of a photovoltaic module according to a first embodiment of the present invention.
Figure 2:
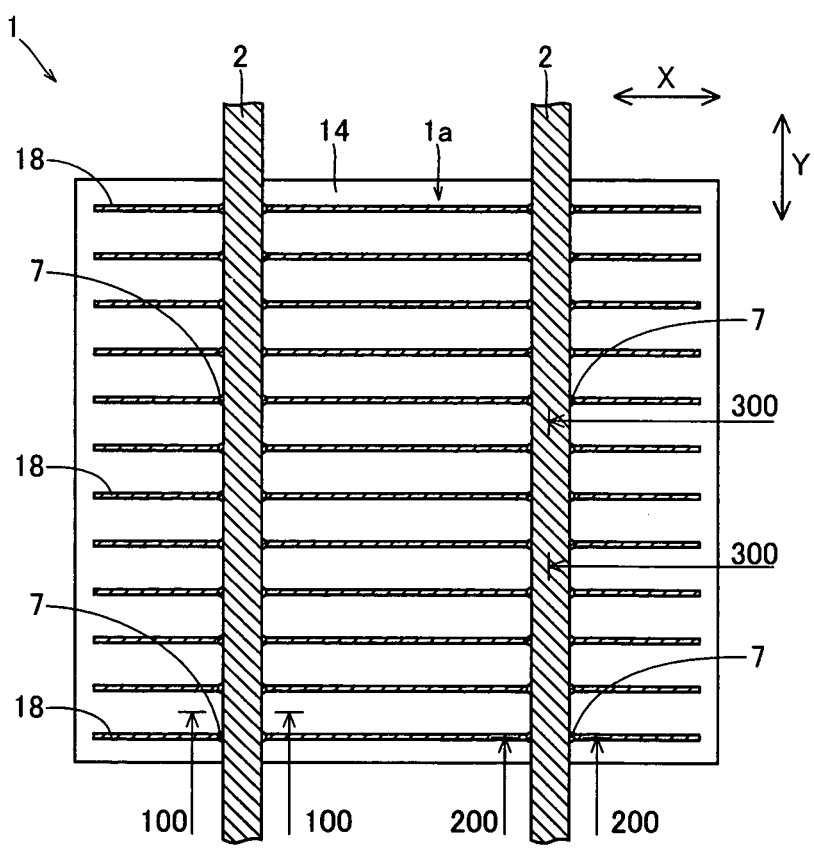
FIG. 2 is a plan view showing a photovoltaic element constituting the photovoltaic module according to the first embodiment shown in FIG. 1, to which tab electrodes are connected.

The photovoltaic module according to the first embodiment includes a plurality of photovoltaic elements 1 as shown in FIG. 1 and has a structure in which the plurality of photovoltaic elements 1 are electrically connected through tab electrodes 2. The tab electrodes 2 electrically connecting the plurality of photovoltaic elements 1 are so arranged as to be electrically connected to finger electrodes 18(19) serving as after-mentioned collectors and extend in a direction Y perpendicular to a direction X (direction in which the finger electrodes 18(19) extend), as shown in FIGS. 1 and 2. The tab electrodes 2 consist of copper foil having a thickness of about 200 μm to about 400 μm and a width of about 1 mm to about 2 mm. A filler 3 consisting of EVA (ethylene vinyl acetate) covers the plurality of photovoltaic elements 1 as shown in FIG. 1. A surface protector 4 consisting of a glass is provided on an upper surface of the filer 3, and a back surface protector 5 consisting of PVF (poly vinyl fluoride) is provided on a lower surface of the filler 3.

Figure 3:
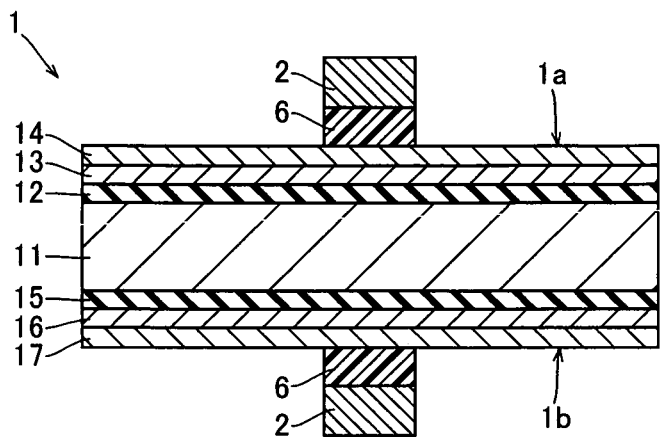
FIG. 3 is a sectional view taken along a line 100-100 in FIG. 2.
Figure 4:
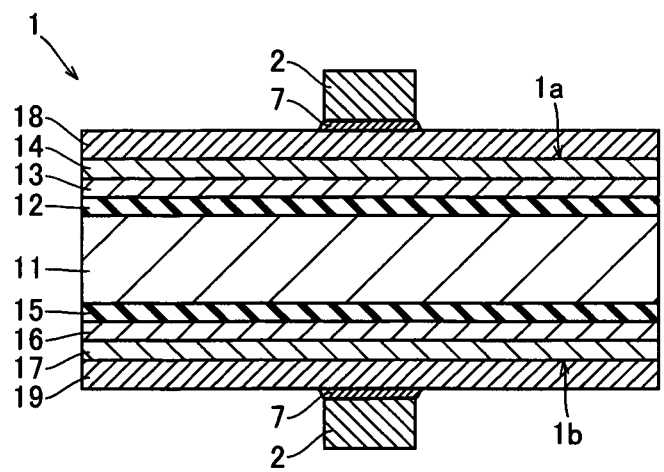
FIG. 4 is a sectional view taken along a line 200-200 in FIG. 2.
Figure 5:
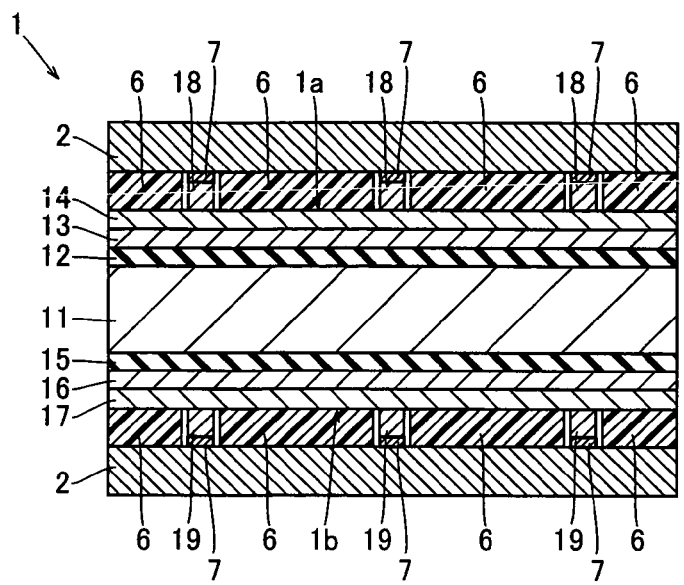
FIG. 5 is a sectional view taken along a line 300-300 in FIG. 2.

According to each photovoltaic element 1 of the first embodiment, a substantially intrinsic i-type amorphous silicon layer 12 having a thickness of about 5 nm to about 20 nm and a p-type amorphous silicon layer 13 having a thickness of about 5 nm to about 20 nm are successively formed on an upper surface of an n-type single-crystalline silicon substrate 11 having a thickness of about 180 μm to about 300 μm, as shown in FIGS. 3 to 5. The n-type single-crystalline silicon substrate 11 is an example of the "photoelectric conversion layer" and the "semiconductor layer" in the present invention, and the i-type amorphous silicon layer 12 and the p-type amorphous silicon layer 13 are examples of the "semiconductor layer" in the present invention. An ITO (indium tin oxide) film 14 as a translucent conductive film having a thickness of about 30 nm to about 150 nm is formed on the p-type amorphous silicon layer 13. According to the first embodiment, a surface of the ITO film 14 opposite to the n-type single-crystalline silicon substrate 11 is a light receiving surface 1a on a front surface side.

An i-type amorphous silicon layer 15, an n-type amorphous silicon layer 16 and an ITO film 17 are successively formed on a lower surface of the n-type single-crystalline silicon substrate 11. Thicknesses of the i-type amorphous silicon layer 15, the n-type amorphous silicon layer 16 and the ITO film 17 are about 5 nm to about 20 nm, about 5 nm to about 20 nm and about 30 nm to about 150 nm, respectively. The i-type amorphous silicon layer 15 and the n-type amorphous silicon layer 16 are examples of the "semiconductor layer" in the present invention. According to the first embodiment, a surface of the ITO film 17 opposite to the n-type single-crystalline silicon substrate 11 is a light receiving surface 1b on a back surface side.

According to each photovoltaic element 1 of the first embodiment, regions formed with respective semiconductor layers (12, 13, 15 and 16) on the upper and lower surfaces of the n-type single-crystalline silicon substrate 11 in plane view are power generation regions. In other words, the light receiving surface 1a constituted by the surface of the ITO film 14 formed on the p-type amorphous silicon layer 13 and the light receiving surface 1b constituted by the surface of the ITO film 17 formed on the n-type amorphous silicon layer 16 are arranged in regions corresponding to the power generation region of the photovoltaic element 1.

Figure 6:
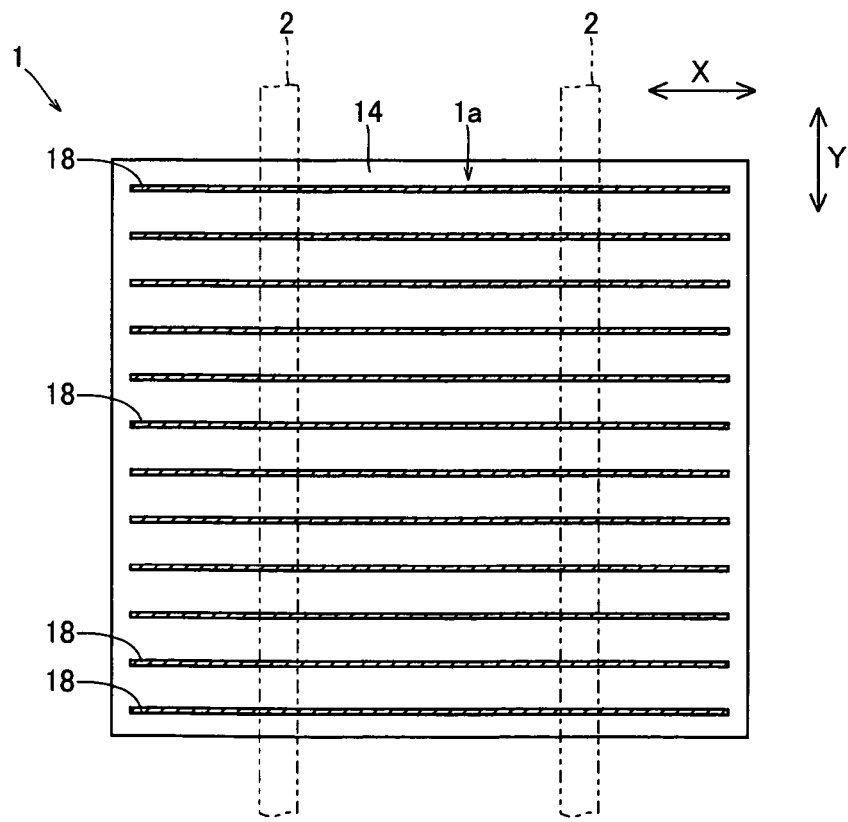
FIG. 6 is a plan view showing configuration of finger electrodes of the photovoltaic element constituting the photovoltaic module according to the first embodiment shown in FIG. 1.

As shown in FIGS. 4 and 5, the finger electrodes 18 each having a thickness of about 10 μm to about 50 μm and consisting of a conductive material formed by conductive paste consisting of epoxy resin or the like prepared by incorporating fine powder of silver (Ag) are formed in prescribed regions on the light receiving surface 1a of the front surface side (surface of the ITO film 14 opposite to the n-type single-crystalline silicon substrate 11). The finger electrodes 18 have a function of collecting generated currents. A plurality of the finger electrodes 18 are so formed as to extend in the direction X and be spaced from each other at intervals of about 2 mm in the direction Y (direction in which the tab electrodes 2 extend) perpendicular to the direction X, as shown in FIG. 6. Each finger electrode 18 has a width of about 100 μm in the Y direction.

A plurality of the finger electrodes 19 having similar configuration to the finger electrodes 18 on the front surface side and consisting of, for example, similar materials to the finger electrodes 18 on the front surface side are formed also in prescribed regions on the light receiving surface 1b of the back surface side (surface of ITO film 17 opposite to the n-type single-crystalline silicon substrate 11), as shown in FIGS. 4 and 5. The collectors of each photovoltaic element 1 of the first embodiment are constituted only by the aforementioned finger electrodes 18 and 19. In other words, bus bar electrodes for aggregating currents collected by the finger electrodes 18 and 19 are not provided in the photovoltaic element 1 of the first embodiment.

Figure 7:
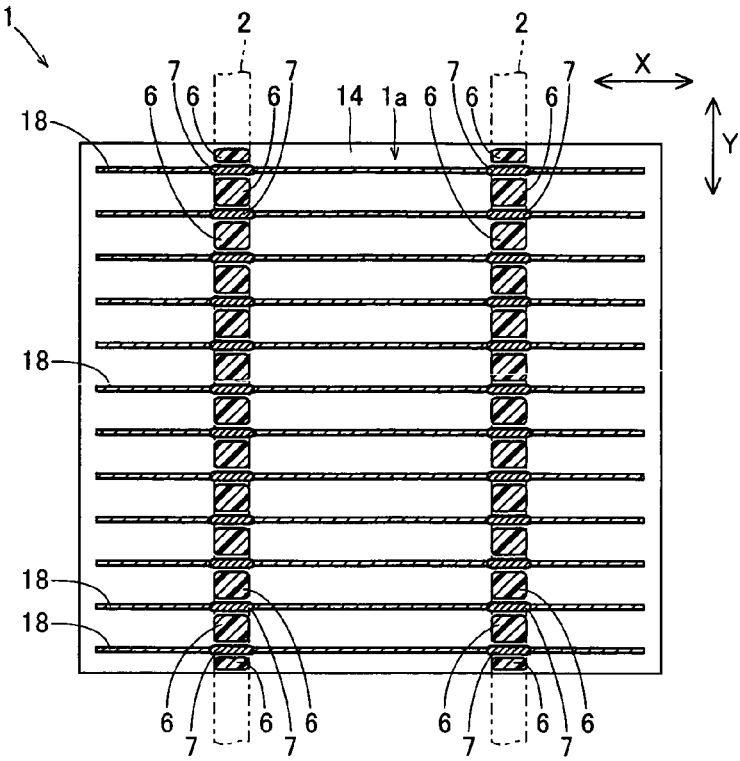
FIG. 7 is a plan view showing the photovoltaic element constituting the photovoltaic module according to the first embodiment shown in FIG. 1, from which the tab electrodes are removed.

In the photovoltaic module according to the first embodiment, each tab electrode 2 is directly bonded to the light receiving surface 1a through an insulating bonding layer 6 consisting of acrylic thermosetting resin in a region corresponding to the power generation region on the front surface side of the photovoltaic element 1, as shown in FIGS. 3 and 5. According to the first embodiment, each insulating bonding layer 6 bonding the light receiving surface 1a and the tab electrode 2 is provided in the region corresponding to the power generation region of the photovoltaic element 1 in which the finger electrode 18 is not formed, as shown in FIG. 7. More specifically, according to the first embodiment, the insulating bonding layer 6 is provided in each region located between the finger electrodes 18 adjacent in the direction Y, in which the tab electrode 2 is arranged.

According to the first embodiment, in each region in which the tab electrode 2 is arranged, a solder layer 7 consisting of Sn—Ag—Cu is provided on an upper surface of each of a plurality of the finger electrodes 18, as shown in FIGS. 5 and 7. The solder layers 7 are provided over substantially entire regions in which the finger electrode 18 and the tab electrode 2 are overlapped in plan view. The tab electrodes 2 and the finger electrodes 18 are electrically connected to each other by the solder layers 7 respectively. As shown in FIGS. 5 and 7, the solder layers 7 are so provided as to be spaced from the insulating bonding layers 6 at prescribed intervals.

A method of connecting the tab electrodes 2 on the back surface side of each photovoltaic element 1 is similar to the aforementioned method of connecting the tab electrodes 2 on the front surface side of each photovoltaic element 1, as shown in FIGS. 3 to 5. More specifically, each tab electrode 2 is directly bonded to the light receiving surface 1b through insulating bonding layer 6 in a region corresponding to the power generation region on the back surface side of the photovoltaic element 1. The tab electrodes 2 are electrically connected to the finger electrodes 19 through the solder layers 7, respectively.

According to the first embodiment, as hereinabove described, the tab electrodes 2 are directly bonded to the light receiving surface 1a through the insulating bonding layers 6 in the region corresponding to the power generation region of the front surface side of the photovoltaic element 1, whereby a bonding strength between the light receiving surface 1a and the tab electrodes 2 can be increased as compared with a bonding strength between the light receiving surface 1a and the tab electrodes 2 in a conventional case where the tab electrodes 2 are bonded through bus bar electrodes formed of conductive paste on the light receiving surface 1a without using the insulating bonding layers 6. Thus, separation of the tab electrodes 2 from the light receiving surface 1a can be suppressed. Consequently, also in a case where the finger electrodes (collectors) 18 consisting of conductive paste are included, the separation of the tab electrodes 2 can be suppressed.

According to the first embodiment, as hereinabove described, the tab electrodes 2 are bonded to the light receiving surface 1a without bus bar electrodes, whereby the bus bar electrodes can be omitted. Thus, an electrode structure can be simplified.

According to the first embodiment, as hereinabove described, in the region corresponding to the power generation region on the front surface side of each photovoltaic element 1, the tab electrodes 2 are bonded to the light receiving surface 1a through the insulating bonding layers 6, whereby a dark current can be inhibited from flowing to the tab electrodes 2 through the bonding layers 6 dissimilarly to a case where the tab electrodes 2 are bonded to the light receiving surface 1*a* through conductive bonding layers. Thus, reduction in a characteristic of the photovoltaic module can be suppressed.

According to the first embodiment, as hereinabove described, each insulating bonding layer 6 is provided in the region in which the tab electrode 2 is arranged and the finger electrode 18 is not formed, whereby the light receiving surface 1*a* and each tab electrode 2 can be bonded through the insulating bonding layer 6 in the region in which the tab electrode 2 is arranged without preventing electrical connection of the tab electrode 2 and the finger electrode 18. In this case, the insulating bonding layer 6 is provided in each region located between the finger electrodes 18 adjacent in the direction Y, in which the tab electrode 2 is arranged, a bonding region between the light receiving surface 1*a* and each tab electrode 2 can be increased in the region in which the tab electrodes 2 is arranged.

According to the first embodiment, as hereinabove described, the tab electrodes 2 and the finger electrodes 18 are electrically connected to each other through the solder layers 7 respectively, whereby the tab electrodes 2 and the finger electrodes 18 can be easily connected to each other by the solder layers 7 respectively.

According to the first embodiment, as hereinabove described, connection of the tab electrodes 2 on the back surface side of each photovoltaic element 1 is performed in a similar manner to the connection of the tab electrodes 2 on the front surface side of each photovoltaic element 1, whereby separation of the tab electrodes 2 can be suppressed also in the back surface side of the photovoltaic element 1.

According to the first embodiment, as hereinabove described, the solder layers 7 are provided over the substantially entire regions in which the finger electrode 18 and the tab electrode 2 are overlapped in plan view, whereby an area of each electrical connection portion of the finger electrodes 18 and the tab electrodes 2 can be increased. Thus, the finger electrodes 18 and the tab electrodes 2 can be inhibited from being electrically disconnected to each other, and resistance of the connection portions of the finger electrodes 18 and the tab electrodes 2 can be reduced.

According to the first embodiment, as hereinabove described, the solder layers 7 are so provided as to be spaced from the insulating bonding layers 6 at prescribed intervals, whereby the insulating bonding layers 6 can be inhibited from protruding into the regions in which the solder layer 7 is provided. Thus, normal electrical connection of the finger electrodes 18 and the tab electrodes 2 by the solder layers 7 can be inhibited from being hindered due to the protruding bonding layers 6.

A process of fabricating the photovoltaic module according to the first embodiment will be now described with reference to FIGS. 1 to 7.

The i-type amorphous silicon layer 12 having a thickness of about 5 nm to about 20 nm and the p-type amorphous silicon layer 13 having a thickness of about 5 nm to about 20 nm are successively formed on the n-type single-crystalline silicon substrate 11 having a thickness of about 180 μm to about 300 μm by plasma CVD (chemical vapor deposition) as shown in FIGS. 3 to 5. Thereafter, the i-type amorphous silicon layer 15 having a thickness of about 5 nm to about 20 nm and the n-type amorphous silicon layer 16 having a thickness of about 5 nm to about 20 nm are successively formed on the lower surface of the n-type single-crystalline silicon substrate 11 by plasma CVD. Then, after the ITO film 14 having a thickness of about 30 nm to about 150 nm are formed on the p-type amorphous silicon layer 13 by sputtering, the ITO film 17 having a thickness of about 30 nm to about 150 nm is formed also on an lower surface of the n-type amorphous silicon layer 16.

The conductive paste consisting of epoxy resin or the like prepared by incorporating fine powder of Ag is applied to prescribed regions on the ITO film 14 by screen printing, as shown in FIGS. 4 and 5. Thereafter, the conductive paste is hardened, thereby forming the finger electrodes 18 on the front surface side consisting of the conductive material each having a thickness of about 10 μm to about 50 μm in the prescribed regions on the ITO film 14. At this time, a plurality of the finger electrodes 18 on the front surface side are so formed as to extend in the direction X and be spaced from each other at intervals of about 2 mm in the direction Y perpendicular to the direction X, as shown in FIG. 6. Thereafter, a plurality of the finger electrodes 19 on the back surface side having similar configuration to the finger electrodes 18 on the front surface side are formed also in the prescribed regions on the lower surface of the ITO film 17 by a forming process similar to the aforementioned forming process of the finger electrodes 18 on the front surface side. Thus, the photovoltaic elements 1 constituting the photovoltaic module according to the first embodiment are formed.

As shown in FIG. 7, a bonding material consisting of insulating resin paste for forming the bonding layer 6, consisting of acrylic thermosetting resin is applied to each region located between the finger electrodes 18 adjacent in the direction Y on the ITO film 14, in which the tab electrode 2 on the front surface side is arranged, by screen printing. Solder paste consisting of Sn—Ag—Cu for forming the solder layer 7 is applied to the upper surface of each of a plurality of the finger electrodes 18 in the regions where the tab electrode 2 on the front surface side is arranged, by screen printing.

Thereafter the tab electrodes 2 each consisting of copper foil having a thickness of about 200 μm to about 400 μm and a width of about 1 mm to about 2 mm are pressed against the regions to which the aforementioned resin paste and solder paste are applied. Heat treatment is performed under a condition of a temperature of about 150° C. to about 200° C. for about 10 minutes to about 60 minutes by hot air heating in this state, thereby hardening the resin paste. Therefore, the resin paste becomes the bonding layers 6 and the surface (light receiving surface 1*a*) of the ITO film 14 and the tab electrodes 2 are bonded through the bonding layers 6. Thereafter, heat treatment is performed under a condition of a temperature of about 230° C. to about 260° C. by hot air heating, thereby hardening the solder paste. Therefore, the solder paste becomes the solder layers 7 and the tab electrodes 2 and the finger electrodes 18 are electrically connected to each other through the solder layers 7 respectively. Thus, the tab electrodes 2 are connected to the front surface of the photovoltaic element 1 as shown in FIG. 2.

The tab electrodes 2 are connected also to the back surface of each photovoltaic element 1 by a connecting process similar to the aforementioned connecting process of the tab electrodes 2 on the front surface side. In other words, the tab electrodes 2 are bonded to the light receiving surface 1*b* through the insulating bonding layers 6, and electrically connected to the finger electrodes 19 through the solder layers 7 respectively.

Finally, an EVA sheet for forming the filler 3, a plurality of the photovoltaic elements 1 connected by the tab electrodes 2, an EVA sheet for forming the filler 3, and the back surface protector 5 consisting of PVF are successively deposited on the surface protector 4 consisting of glass, as shown in FIG. 1. Thereafter, the photovoltaic module according to the first embodiment are formed by performing a vacuum laminating process while heating.

Figure 8:
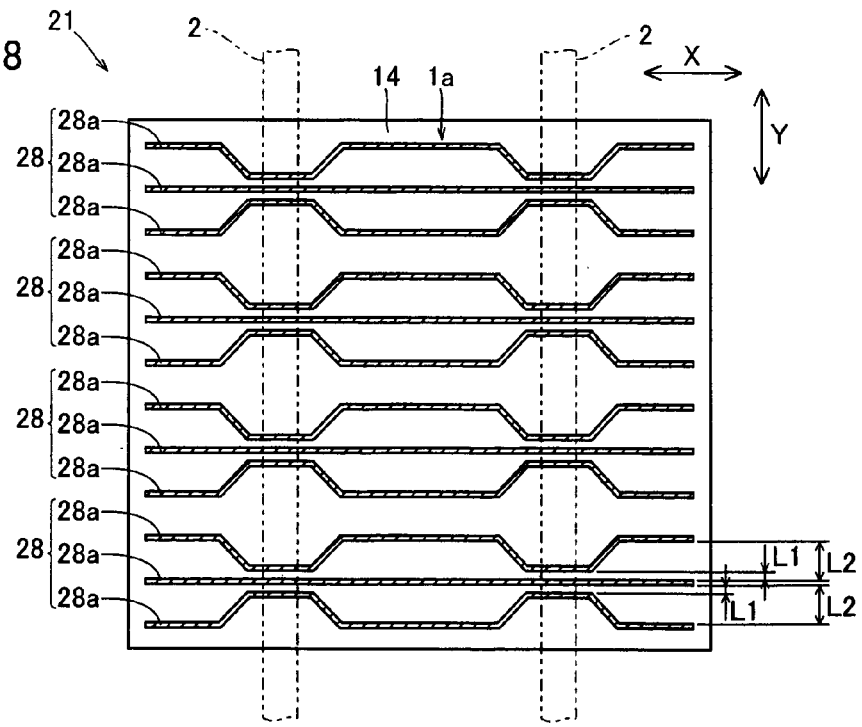
FIG. 8 is a plan view showing configuration of finger electrodes of a photovoltaic element constituting a photovoltaic module according to a first modification of the first embodiment.

With reference to FIGS. 8 and 9, a structure of a photovoltaic module according to a first modification of the first embodiment will be now described. In a photovoltaic element 21 according to the first modification of the first embodiment, collectors constituted only by the finger electrodes 28a are formed in prescribed regions on the light receiving surface 1a of the front surface side similarly to the aforementioned first embodiment. A plurality of the finger electrodes 28a serving as the collectors are so formed as to extend in the direction X and be spaced at prescribed intervals in the direction Y (direction in which the tab electrodes 2 extend) perpendicular to the direction X. Each finger electrode 28a has a thickness of about 10 μm to about 50 μm and a width of about 100 μm in the direction Y, and consists of a conductive material formed by conductive paste consisting of epoxy resin or the like prepared by incorporating fine powder of Ag.

According to the first modification of the first embodiment, a plurality of the finger electrodes 28a are divided into a plurality of groups 28 each including three finger electrodes 28a as shown in FIG. 8. The three finger electrodes 28a in the same group 28 are so formed that a distance L1 in the direction Y between the finger electrodes 28a adjacent in the regions in which the tab electrode 2 is arranged is smaller than a distance L2 in the direction Y between the finger electrodes 28a adjacent in the regions in which the tab electrode 2 is not arranged.

According to the first modification of the first embodiment, a plurality of the finger electrodes having similar configuration to the finger electrodes 28a on the front surface side and consisting of similar materials to the finger electrodes 28a on the front surface side are formed also in prescribed regions on a light receiving surface of the back surface side (not shown).

In the photovoltaic module according to the first modification of the first embodiment, each tab electrode 2 is directly bonded to the light receiving surface 1a through insulating bonding layer 26 consisting of acrylic thermosetting resin in a region corresponding to the power generation region on the front surface side of the photovoltaic element 21, as shown in FIG. 9. According to the first modification of the first embodiment, each insulating bonding layer 26 bonding the light receiving surface 1a and the tab electrode 2 is provided in the region corresponding to the power generation region of the photovoltaic element 21 in which the finger electrode 28a is not formed. More specifically, according to the first modification of the first embodiment, the insulating bonding layer 26 is provided in each region located between the adjacent groups 28 each including the three finger electrodes 28a in the direction Y, in which the tab electrode 2 is arranged.

According to the first modification of the first embodiment, in each region in which the tab electrode 2 is arranged, a solder layer 27 consisting of Sn—Ag—Cu is provided on an upper surface of each of a plurality of the finger electrodes 28a. The tab electrodes 2 and the finger electrodes 28a are electrically connected to each other by the solder layers 27 respectively.

A method of connecting the tab electrodes 2 on the back surface side of the photovoltaic element 21 is similar to the aforementioned method of connecting the tab electrodes 2 on the front surface side of the photovoltaic element 21.

According to the first modification of the first embodiment, as hereinabove described, the three finger electrodes 28a in the same group 28 are so formed that a distance L1 in the direction Y between the adjacent finger electrodes 28a in the regions in which the tab electrode 2 is arranged is smaller than a distance L2 in the direction Y between the adjacent finger electrodes 28a in the regions in which the tab electrode 2 is not arranged, and the insulating bonding layer 26 is provided in each region located between the adjacent groups 28 in the direction Y in which the tab electrode 2 is arranged. Therefore, the distance in the direction Y between the adjacent groups 28 is increased in each region in which the tab electrode 2 is arranged, whereby an area of a region to which the bonding layer 26 arranged between the groups 28 is applied can be increased. Thus, application of the insulating bonding layers 26 to the light receiving surface 1a can be easily performed.

Remaining effects of the first modification of the first embodiment are similar to those of the aforementioned first embodiment.

A structure of a photovoltaic module according to a second modification of the first embodiment will be now described with reference to FIGS. 10 and 11. In a photovoltaic element 31 according to the second modification of the first embodiment, collectors constituted only by the finger electrodes 38a are formed in prescribed regions on the light receiving surface 1a of the front surface side similarly to the aforementioned first embodiment. A plurality of the finger electrodes 38a serving as the collectors are so formed as to extend in the direction X and be spaced at prescribed intervals in the direction Y (direction in which the tab electrodes 2 extend) perpendicular to the direction X. Each finger electrode 38a has a thickness of about 10 μm to about 50 μm and a width of about 100 μm in the direction Y, and consists of a conductive material formed by conductive paste consisting of epoxy resin or the like prepared by incorporating fine powder of Ag.

According to the second modification of the first embodiment, a plurality of the finger electrodes 38a are divided into a plurality of groups 38 each including three finger electrodes 38a as shown in FIG. 10. The three finger electrodes 38a included in the same group 38 are aggregated into one finger electrode 38a of the three finger electrodes 38a in each region in which the tab electrode 2 is arranged. According to the second modification of the first embodiment, a width W1 in the direction Y of each aggregated finger electrode 38a located in the region in which the tab electrode 2 is arranged is substantially identical with a width W2 (about 100 μm) in the direction Y of each finger electrode 38a located in the region in which the tab electrode 2 is not arranged.

An interval D1 between the aggregated finger electrodes 38a of the two groups 38 adjacent to each other is larger than a distance D2 between the finger electrodes 38a opposed to each other of the two groups 38 adjacent to each other.

According to the second modification of the first embodiment, a plurality of the finger electrodes having similar configuration to the finger electrodes 38a on the front surface side and consisting of, for example, similar materials to the finger electrodes 38a on the front surface side are formed also in prescribed regions on the light receiving surface on the back surface side (not shown).

Figure 11:
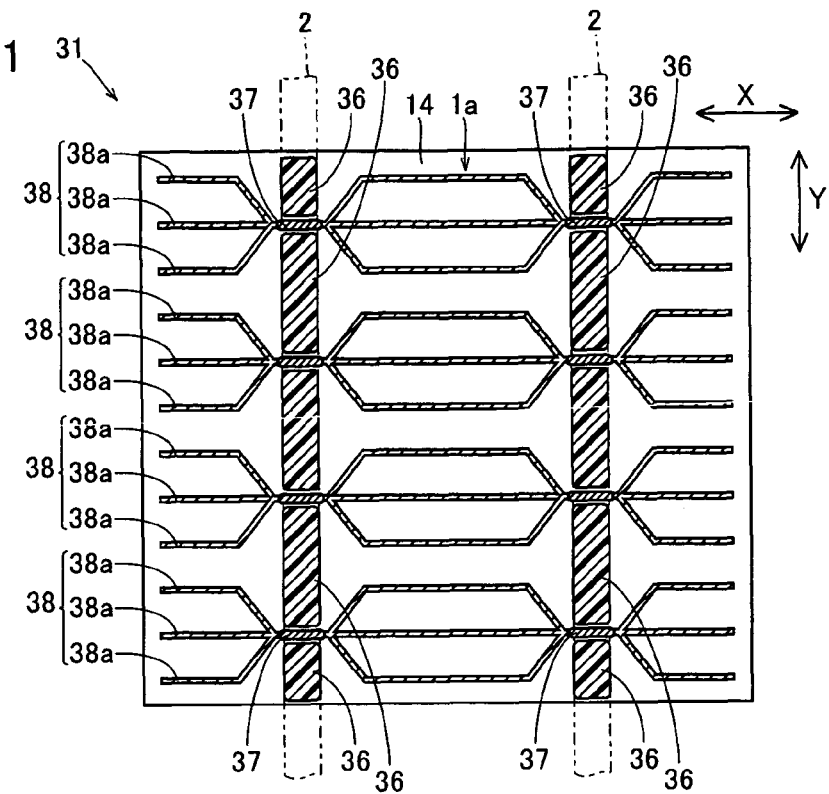
FIG. 11 is a plan view showing the photovoltaic element constituting the photovoltaic module according to the second modification of the first embodiment, from which the tab electrodes are removed.

In the photovoltaic module according to the second modification of the first embodiment, each tab electrode 2 is directly bonded to the light receiving surface 1a through an insulating bonding layer 36 consisting of acrylic thermosetting resin in a region corresponding to the power generation region on the front surface side of the photovoltaic element 31, as shown in FIG. 11. According to the second modification of the first embodiment, each insulating bonding layer 36 bonding the light receiving surface 1a and the tab electrode 2 is provided in the region corresponding to the power generation region of the photovoltaic element 31 in which the finger electrode 38a is not formed. More specifically, according to the second modification of the first embodiment, the insulating bonding layer 36 is provided in each region located between the adjacent groups 38 each including the three finger electrodes 38a in the direction Y, in which the tab electrode 2 is arranged.

According to the second modification of the first embodiment, in the regions in which the tab electrode 2 is arranged, solder layers 37 consisting of Sn—Ag—Cu are provided on upper surfaces of a plurality of the finger electrodes 38a. The tab electrodes 2 and the finger electrodes 38a are electrically connected to each other by the solder layers 37 respectively.

A method of connecting the tab electrodes 2 on the back surface side of the photovoltaic element 31 is similar to the aforementioned method of connecting the tab electrodes 2 on the front surface side of the photovoltaic element 31.

According to the second modification of the first embodiment, as hereinabove described, the three finger electrodes 38a included in the same group 38 are aggregated into one finger electrode 38a of the three finger electrodes 38a in each region in which the tab electrode 2 is arranged, and the insulating bonding layer 36 is provided in each region located between the adjacent groups 38 in the direction Y in which the tab electrode 2 is arranged. Therefore, an area of each region in which the finger electrode 38a is not formed can be increased in the region in which tab electrode 2 is arranged, whereby an area of a bonding region of the light receiving surface 1a and each tab electrode 2 can be increased. Thus, a bonding strength between the light receiving surface 1a and the tab electrodes 2 can be increased.

Remaining effects of the second modification of the first embodiment are similar to those of the aforementioned first embodiment.

A structure of a photovoltaic module according to a third modification of the first embodiment will be now described with reference to FIGS. 12 and 13. In a photovoltaic element 41 according to the third modification of the first embodiment, collectors constituted only by the finger electrodes 48a are formed in prescribed regions on the light receiving surface 1a of the front surface side similarly to the aforementioned first embodiment. A plurality of the finger electrodes 48a serving as the collectors are so formed as to extend in the direction X and be spaced at prescribed intervals in the direction Y (direction in which the tab electrodes 2 extend) perpendicular to the direction X. Each finger electrode 48a has a thickness of about 10 μm to about 50 μm and a width of about 100 μm in the direction Y, and consists of a conductive material formed by conductive paste consisting of epoxy resin or the like prepared by incorporating fine powder of Ag.

Figure 12:
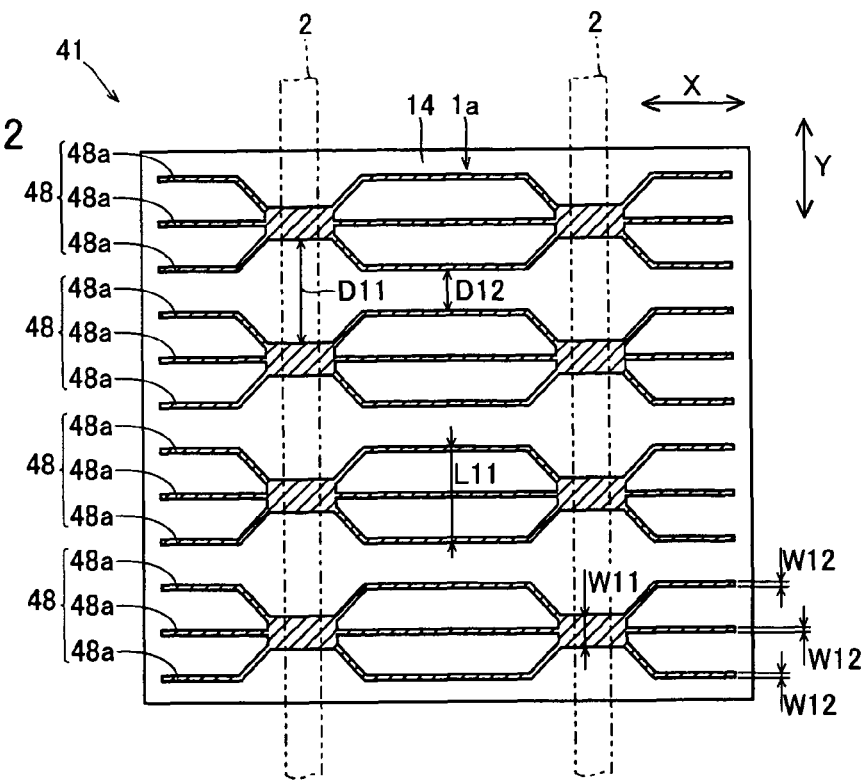
FIG. 12 is a plan view showing configuration of finger electrodes of a photovoltaic element constituting a photovoltaic module according to a third modification of the first embodiment.

According to the third modification of the first embodiment, a plurality of the finger electrodes 48a are divided into a plurality of groups 48 each including three finger electrodes 48a as shown in FIG. 12. The three finger electrodes 48a included in the same group 48 are aggregated into one finger electrode 48a of the three finger electrodes 48a in each region in which the tab electrode 2 is arranged. According to the third modification of the first embodiment, a width W11 (about 300 μm to about 1 mm) in the direction Y of each aggregated finger electrode 48a located in the region in which the tab electrode 2 is arranged is larger than a width W12 (about 100 μm) in the direction Y of each finger electrode 48a located in the region in which the tab electrode 2 is not arranged and is smaller than a distance L11 between the finger electrodes 48a located at outermost positions of the three finger electrodes 48a included in the same group 48.

An interval D11 between the aggregated finger electrodes 48a in the two groups 48 adjacent to each other is larger than a distance D12 between the finger electrodes 48a opposed to each other of the two groups 48 adjacent to each other.

According to the third modification of the first embodiment, a plurality of the finger electrodes having similar configuration to the finger electrodes 48a on the front surface side and consisting of similar materials to the finger electrodes 48a on the front surface side are formed also in prescribed regions on the light receiving surface of the back surface side (not shown).

Figure 13:
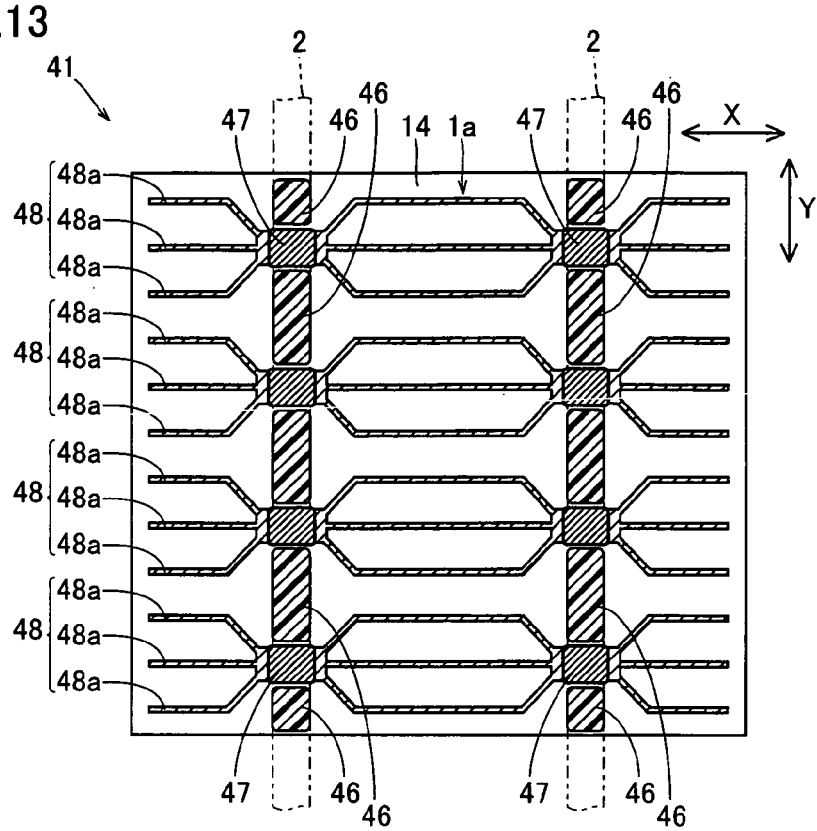
FIG. 13 is a plan view showing the photovoltaic element constituting the photovoltaic module according to the third modification of the first embodiment, from which the tab electrodes are removed.

In the photovoltaic module according to the third modification of the first embodiment, each tab electrode 2 is directly bonded to the light receiving surface 1a through an insulating bonding layer 46 consisting of acrylic thermosetting resin in a region corresponding to the power generation region on the front surface side of the photovoltaic element 41, as shown in FIG. 13. According to the third modification of the first embodiment, each insulating bonding layer 46 bonding the light receiving surface 1a and the tab electrode 2 is provided in the region corresponding to the power generation region of the photovoltaic element 41 in which the finger electrode 48a is not formed. More specifically, according to the third modification of the first embodiment, the insulating bonding layer 46 is provided in each region located between the adjacent groups 48 each including the three finger electrodes 48a in the direction Y, in which the tab electrode 2 is arranged.

According to the third modification of the first embodiment, in the regions in which the tab electrode 2 is arranged, solder layers 47 consisting of Sn—Ag—Cu are provided on upper surfaces of the finger electrodes 48a each having the larger width W11 (see FIG. 12) in the direction Y. The tab electrodes 2 and the finger electrodes 48a are electrically connected to each other by the solder layers 47 respectively.

A method of connecting the tab electrodes 2 on the back surface side of the photovoltaic element 41 is similar to the aforementioned method of connecting the tab electrodes 2 on the front surface side of the photovoltaic element 41.

According to the third modification of the first embodiment, as hereinabove described, the three finger electrodes 48a included in the same group 48 are aggregated into one finger electrode 48a of the three finger electrodes 48a in each region in which the tab electrode 2 is arranged, and the insulating bonding layer 46 is provided in each region located between the adjacent groups 48 in the direction Y in which the tab electrode 2 is arranged. Thus, an area of a bonding region of the light receiving surface 1a and each tab electrode 2 can be increased similarly to the second modification of the aforementioned first embodiment, whereby a bonding strength between the light receiving surface 1a and the tab electrodes 2 can be increased.

According to the third modification of the first embodiment, as hereinabove described, the width W11 in the direction Y of each aggregated finger electrode 48a located in the region in which the tab electrode 2 is arranged is larger than the width W12 in the direction Y of each finger electrode 48a located in the region in which the tab electrode 2 is not arranged. Thus, a contact area of each tab electrode 2 and the finger electrode 48a can be increased in the region in which the tab electrode 2 is arranged, whereby contact resistance between the tab electrodes 2 and the finger electrode 48a can be reduced.

Remaining effects of the third modification of the first embodiment are similar to those of the aforementioned first embodiment.

Second Embodiment

According to a second embodiment of the present invention, a case where finger electrodes are divided in regions where a tab electrode is arranged will be now described with reference to FIGS. 14 to 19, dissimilarly to the aforementioned first embodiment.

Figure 14:
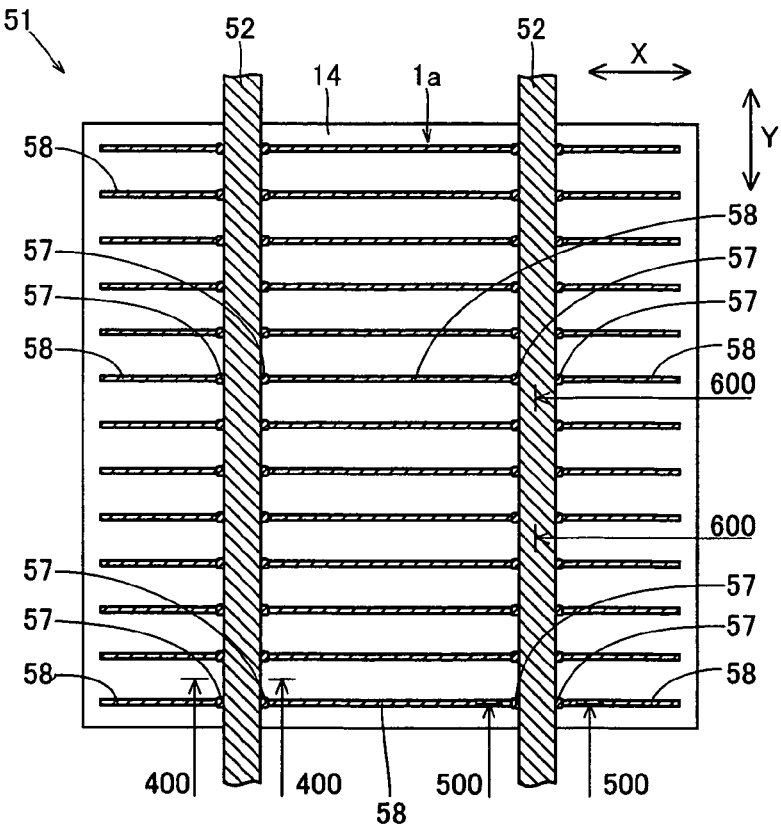
FIG. 14 is a plan view showing a photovoltaic element constituting a photovoltaic module according to a second embodiment of the present invention, to which tab electrodes are connected.

In a photovoltaic module according to the second embodiment, tab electrodes 52 electrically connecting a plurality of photovoltaic elements 51 are so arranged as to be electrically connected to finger electrodes 58(59) serving as after-mentioned collectors and extend in a direction Y perpendicular to a direction X (direction in which the finger electrodes 58(59) extend), as shown in FIG. 14. Each tab electrode 52 consists of copper foil having a thickness of about 200 μm to about 400 μm and a width of about 1 mm to about 2 mm.

Figure 15:
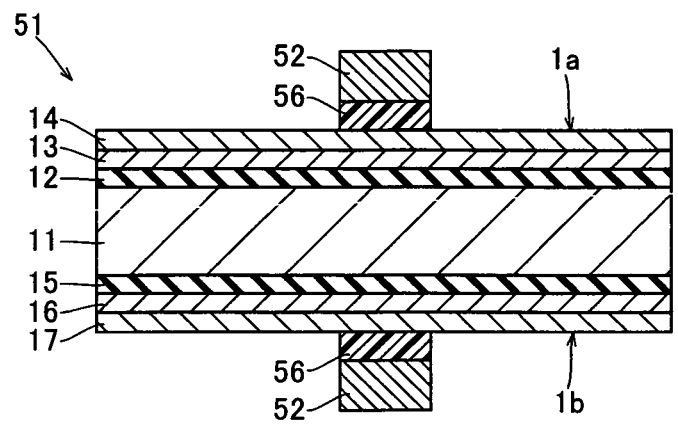
FIG. 15 is a sectional view taken along a line 400-400 in FIG. 14.
Figure 16:
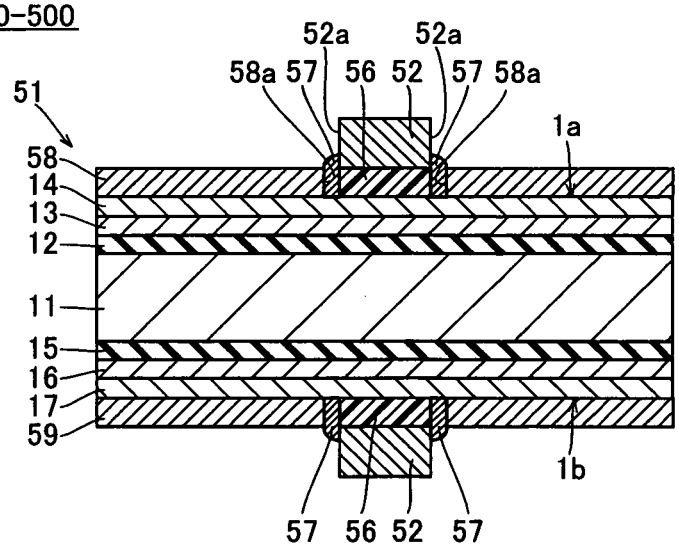
FIG. 16 is a sectional view taken along a line 500-500 in FIG. 14.
Figure 17:
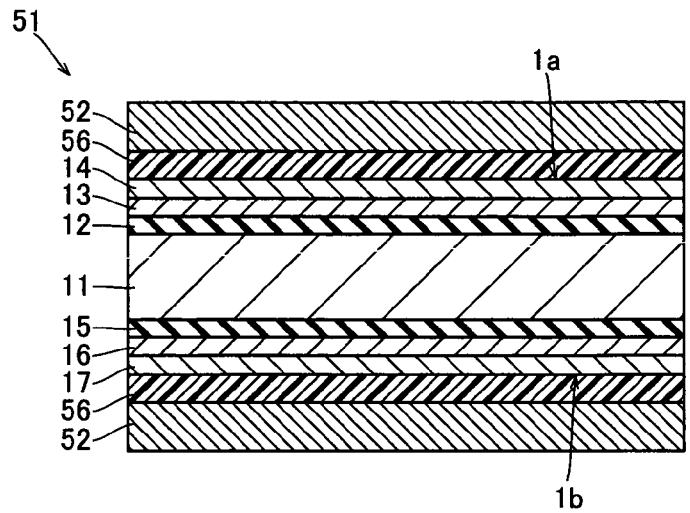
FIG. 17 is a sectional view taken along a line 600-600 in FIG. 14.

In the photovoltaic elements 51 according to the second embodiment, as shown in FIGS. 15 to 17, the i-type amorphous silicon layer 12, the p-type amorphous silicon layer 13 and the ITO film 14 are successively formed on the n-type single-crystalline silicon substrate 11 similarly to the photovoltaic elements 1 according to the aforementioned first embodiment. The i-type amorphous silicon layer 15, the n-type amorphous silicon layer 16 and the ITO film 17 are successively formed on the lower surface of the n-type single-crystalline silicon substrate 11.

According to the second embodiment, a surface of the ITO film 14 opposite to the n-type single-crystalline silicon substrate 11 is a light receiving surface 1a on a front surface side and a surface of the ITO film 17 opposite to the n-type single-crystalline silicon substrate 11 is a light receiving surface 1b on a back surface side, similarly to the aforementioned first embodiment. The light receiving surfaces 1a and 1b are arranged in regions corresponding to the power generation regions.

Figure 18:
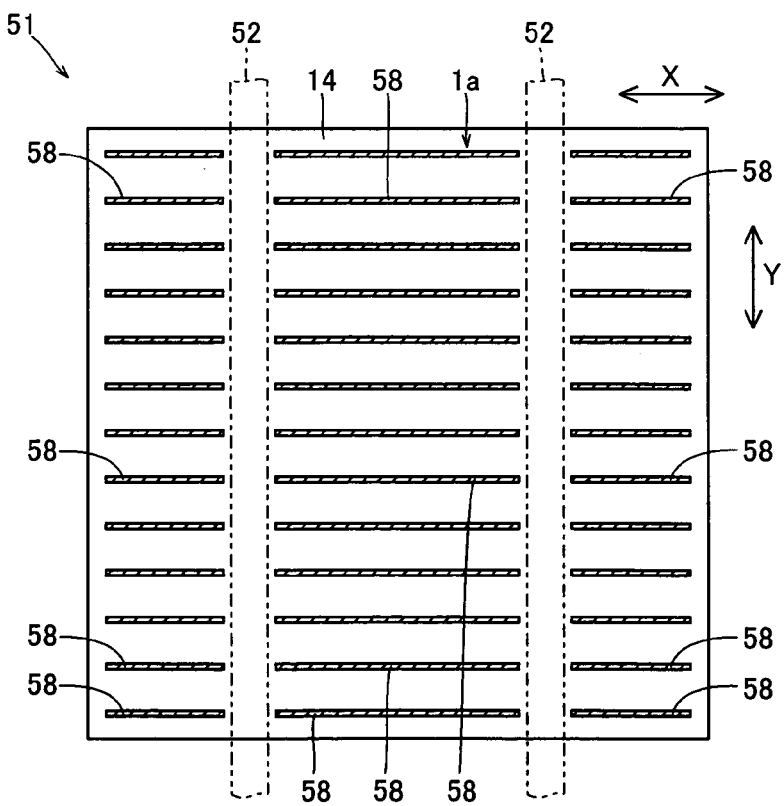
FIG. 18 is a plan view showing configuration of finger electrodes of a photovoltaic element constituting a photovoltaic module according to the second embodiment shown in 14.

As shown in FIG. 16, the finger electrodes 58 each having a thickness of about 10 μm to about 50 μm and consisting of a conductive material formed by conductive paste consisting of epoxy resin or the like prepared by incorporating fine powder of Ag are formed in prescribed regions on the light receiving surface 1a of the front surface side. A plurality of the finger electrodes 58 are so formed as to extend in the direction X and be spaced from each other at intervals of about 2 mm in the direction Y (direction in which the tab electrodes 52 extend) perpendicular to the direction X, as shown in FIG. 18. Each finger electrode 58 has a width of about 100 μm in the Y direction.

In the photovoltaic elements 51 according to the second embodiment, the finger electrodes 58 are divided in the region in which the tab electrode 52 is arranged so as not to cross the regions in which the tab electrode 52 is arranged. In other words, according to the second embodiment, each finger electrode 58 extending in the direction X is divided into three.

A plurality of the finger electrodes 59 having similar configuration to the finger electrodes 58 on the front surface side and consisting of similar materials to the finger electrodes 58 on the front surface side are formed also in prescribed regions on the light receiving surface 1b of the back surface side, as shown in FIG. 16. The collectors of each photovoltaic element 51 of the second embodiment are constituted only by the aforementioned finger electrodes 58 and 59. In other words, bus bar electrodes for aggregating currents collected by the finger electrodes 58 and 59 are not provided in the photovoltaic element 51 of the second embodiment.

Figure 19:
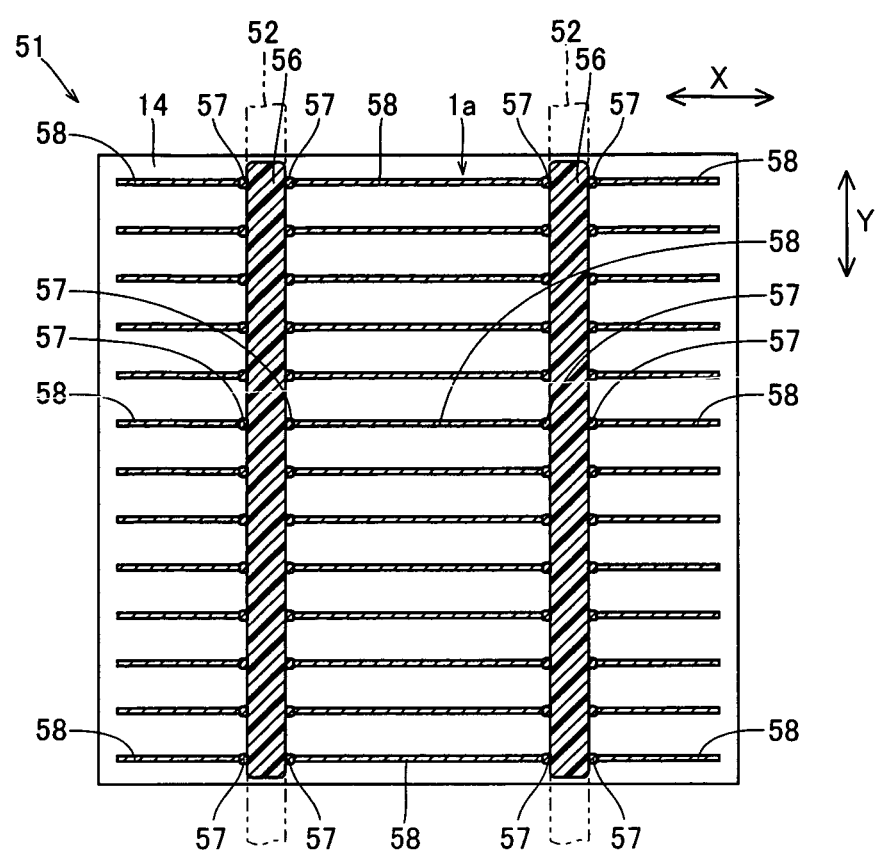
FIG. 19 is a plan view showing the photovoltaic element constituting the photovoltaic module according to the second embodiment shown in FIG. 14, from which the tab electrodes are removed.

In the photovoltaic module according to the second embodiment, each tab electrode 52 is directly bonded to the light receiving surface 1a through insulating bonding layer 56 consisting of acrylic thermosetting resin in a region corresponding to the power generation region on the front surface side of the photovoltaic element 51, as shown in FIGS. 15 to 17. According to the second embodiment, each insulating bonding layer 56 bonding the light receiving surface 1a and the tab electrode 52 is provided in the region corresponding to the power generation region of the photovoltaic element 51 in which the finger electrode 58 is not formed, as shown in FIG. 19. More specifically, according to the second embodiment, the insulating bonding layer 56 is so provided in each region in which the tab electrode 52 is arranged so as extend continuously along the direction Y (direction in which the tab electrodes 52 extend).

According to the second embodiment, solder layers 57 consisting of Sn—Ag—Cu are provided on both sides in the direction X of the region in which the tab electrode 52 on the light receiving surface 1a is provided as shown in FIGS. 16 and 19. Each solder layer 57 electrically connect a part of both side surfaces 52a of the tab electrode 52 and divided both ends 58a of the finger electrode 58 in portions of the both side surfaces in the direction X of the tab electrode 52 and the insulating bonding layer 56, as shown in FIG. 16.

A method of connecting the tab electrodes 52 on the back surface side of the photovoltaic element 51 is similar to the aforementioned method of connecting the tab electrodes 52 on the front surface side of the photovoltaic element 51, as shown in FIGS. 15 to 17. More specifically, each tab electrode 52 is directly bonded to the light receiving surface 1b through the insulating bonding layer 56 in a region corresponding to the power generation region on the back surface side of the photovoltaic element 51. The tab electrodes 52 are electrically connected to the finger electrodes 59 through the solder layers 57, respectively.

Remaining structures of the second embodiment are similar to those of the aforementioned first embodiment.

According to the second embodiment, as hereinabove described, the tab electrodes 52 are directly bonded to the light receiving surface 1a through the insulating bonding layers 56 in the region corresponding to the power generation region of the front surface side of the photovoltaic element 51, whereby a bonding strength between the light receiving surface 1a and the tab electrodes 52 can be increased as compared with a bonding strength between the light receiving surface 1a and the tab electrodes 52 in a conventional case where the tab electrodes 52 are bonded through bus bar electrodes formed of conductive paste on the light receiving surface 1a. Thus, separation of the tab electrodes 52 from the light receiving surface 1a can be suppressed. Consequently, also in a case where the finger electrodes (collectors) 58 consisting of conductive paste are included, separation of the tab electrodes 52 can be suppressed.

According to the second embodiment, as hereinabove described, each finger electrode 58 is divided in the region in which the tab electrode 52 is arranged, whereby the finger electrode 58 is not formed in the region in which the tab electrode 52 is arranged. Therefore, the insulating bonding layers 56 can be so provided as to extend continuously along the direction Y. Thus, an area of a bonding region of the light receiving surface 1a and each tab electrode 52 can be increased, whereby a bonding strength between the light receiving surface 1a and each tab electrode 52 can be increased. In this case, the side surfaces of the tab electrodes 52 and the divided ends of the finger electrodes 58 are electrically connected to each other in the portions of the both side surfaces in the direction X of the tab electrodes 52 and the insulating bonding layers 56 through the solder layers 57. Thus, even if the finger electrodes 58 are divided in the regions in which the tab electrode 52 is arranged, the tab electrodes 52 and the finger electrodes 58 can be easily electrically connected to each other through the solder layers 57, respectively.

According to the second embodiment, as hereinabove described, the tab electrodes 52 on the back surface side of the photovoltaic element 51 are connected in a similar manner to the tab electrodes 52 on the front surface side of the photovoltaic element 51, whereby separation of the tab electrodes 52 and reduction in the power generation region can be suppressed also on the back surface side of the photovoltaic element 51.

Remaining effects of the second embodiment are similar to those of the aforementioned first embodiment.

A process of fabricating the photovoltaic module according to the second embodiment will be now described with reference to FIGS. 14 to 19.

The ITO films 14 and 17 are formed by a similar fabrication process to the aforementioned first embodiment as shown in FIGS. 15 to 17.

Then, the conductive paste consisting of epoxy resin or the like prepared by incorporating fine powder of Ag is applied to prescribed regions on the ITO film 14 by screen printing, as shown in FIG. 16. Thereafter, the conductive paste is hardened, thereby forming the finger electrodes 58 on the front surface side consisting of the conductive material each having a thickness of about 10 µm to about 50 µm in the prescribed regions on the ITO film 14. At this time, the finger electrodes 58 on the front surface side are so formed as to extend in the direction X without crossing the regions in which the tab electrode 52 is arranged, as shown in FIG. 18. In addition, a plurality of the finger electrodes 58 on the front surface side are so formed as to be spaced from each other at intervals of about 2 mm in the direction Y perpendicular to the direction X. Thereafter, a plurality of the finger electrodes 59 on the back surface side having similar configuration to the finger electrodes 58 on the front surface side are formed also in the prescribed regions on the lower surface of the ITO film 17 by a forming process similar to the aforementioned forming process of the finger electrodes 58 on the front surface side. Thus, the photovoltaic elements 51 constituting the photovoltaic module according to the second embodiment are formed.

As shown in FIG. 19, insulating resin paste for forming the bonding layer 56, consisting of acrylic thermosetting resin is applied to the ITO film 14 in each region in which the tab electrode 52 on the front surface side is arranged so as to extend continuously along the direction Y, by screen printing. Solder paste consisting of Sn—Ag—Cu for forming the solder layer 57 is applied to the both sides in the X direction of each region in which the tab electrode 52 on the ITO film 14 of the front side is arranged so as to come in contact with ends of each finger electrode 58 on sides of the regions in which the tab electrode 52 is arranged, by screen printing.

Thereafter, the tab electrodes 52 each consisting of copper foil having a thickness of about 200 µm to about 400 µm and a width of about 1 mm to about 2 mm are pressed against the regions to which the aforementioned resin paste is applied. Heat treatment is performed under a condition of a temperature of about 150° C. to about 200° C. for about 10 minutes to about 60 minutes by hot air heating in this state, thereby hardening the resin paste. Therefore, the resin paste becomes the bonding layers 56 and the surface (light receiving surface 1a) of the ITO film 14 and the tab electrodes 52 are bonded through the bonding layers 56 respectively. Thereafter, heat treatment is performed under a condition of a temperature of about 230° C. to about 260° C. by hot air heating, thereby hardening the solder paste. Therefore, the solder paste becomes the solder layers 57 and the tab electrodes 52 and the finger electrodes 58 are electrically connected to each other through the solder layers 57 respectively. Thus, the tab electrodes 52 are connected to the front surface of the photovoltaic element 51 as shown in FIG. 14.

The tab electrodes 52 are connected also to the back surface of the photovoltaic element 51 by a connecting process similar to the aforementioned connecting process of the tab electrodes 52 on the front surface side. In other words, the tab electrodes 52 are bonded to the light receiving surface 1b through the insulating bonding layers 56, and electrically connected to the finger electrodes 59 through the solder layers 57 respectively.

Subsequent processes of fabricating the photovoltaic module according to the second embodiment is similar to the processes after the tab electrodes 2 of the aforementioned first embodiment are connected.

Although the present invention has been described and illustrated in detail, it is clearly understood that the same is by way of illustration and example only and is not to be taken by way of limitation, the spirit and scope of the present invention being limited only by the terms of the appended claims.

For example, while the insulating resin paste consisting of acrylic thermosetting resin is employed as the bonding material for bonding the tab electrodes in the aforementioned first and second embodiments, the present invention is not restricted to this but insulating resin paste consisting of thermosetting resin other than acrylic thermosetting resin may be alternatively employed. The thermosetting resin other than acrylic thermosetting resin includes silicon thermosetting resin or epoxy thermosetting resin, for example. Alternatively, insulating resin paste consisting UV curable resin or UV-thermosetting resin may be also employed. When the insulating resin paste consisting UV curable resin or UV-thermosetting resin is hardened, the process is preferably performed in the following UV irradiation condition. In other words, the preferable UV irradiation condition is a UV irradiation intensity of about 100 mW/cm$^2$ to about 600 mW/cm$^2$, UV irradiation time of about 1 minute to about 5 minutes. When the insulating resin paste consisting of UV-thermosetting resin is hardened, heat treatment may be performed under a condition of a temperature of about 100° C. to about 180° C. for about 10 minutes to about 90 minutes without UV irradiation.

While the resin paste and the solder paste are applied to the surface of the ITO film by screen printing in the aforementioned first and second embodiments, the present invention is not restricted to this but the resin paste and the solder paste may be alternatively formed on the surface of the ITO film by a formation method other than the screen printing as far as formation in a minute (fine) region can be performed. For example, the resin paste and the solder paste may be alternatively applied to the surface of the ITO film by dispenser.

While the resin paste and the solder paste are hardened by hot air heating in the aforementioned first and second embodiments, the present invention is not restricted to this but the resin paste and the solder paste may be alternatively hardened by a method other than hot air heating. A method other than hot air heating includes reflow heating, beam irradiation heating and laser irradiation heating, for example.

While the tab electrodes consisting of copper foil are employed in the aforementioned first and second embodiments, the present invention is not restricted to this but tab electrodes of foil consisting of material other than copper may be alternatively employed, or tab electrodes of wire may be alternatively employed. Alternatively, the tab electrodes of foil or wire coated with solders in advance may be employed.

While the surface of the ITO film is the light receiving surface by forming the ITO film on the semiconductor layer in the aforementioned first and second embodiments, the present invention is not restricted to this but the present invention may be applied to elements not formed with the ITO film on the semiconductor layer. Alternatively, other transparent conductive film may be employed instead of the ITO film.

While the photovoltaic elements each having a structure in which the i-type amorphous silicon layers are formed between the n-type single-crystalline silicon substrate and the p-type amorphous silicon layer and between the n-type single-crystalline silicon substrate and the n-type amorphous silicon layer are employed as photovoltaic elements constituting a photovoltaic module in the aforementioned first and second embodiments, the present invention is not restricted to this but the present invention can be applied to a photovoltaic module employing various types of photovoltaic elements such as single-crystalline photovoltaic elements, amorphous photovoltaic elements and microcrystalline photovoltaic elements.

While the tab electrodes are bonded on the surface of the ITO film on the semiconductor layer through the insulating bonding layers in the aforementioned first and second embodiments, the present invention is not restricted to this but the tab electrodes may alternatively be bonded on the surface of the semiconductor layer through the insulating bonding layers without forming the ITO film on the semiconductor layer. Alternatively, the ITO film may be so formed on the semiconductor layer as to expose a part of the surface of the semiconductor layer, and the tab electrodes may be alternatively bonded on the exposed surface of the semiconductor layer through the insulating bonding layers. According to this structure, a bonding strength of the element and each tab electrode can be enhanced as compared with a case where the tab electrodes are bonded on the surface of the ITO film through the insulating bonding layers.

While the resin paste and the solder paste are hardened by different heat treatment processes respectively in the aforementioned first and second embodiments, the present invention is not restricted to this but the resin paste and the solder paste may be alternatively hardened by the same heat treatment processes.

While the tab electrodes and the finger electrodes are electrically connected to each other through the solder layers respectively in the aforementioned first embodiment, the present invention is not restricted to this but the tab electrodes may be brought into contact with the finger electrodes without the solder layers, thereby electrically connecting the tab electrodes and the finger electrodes.

What is claimed is:
1. A photovoltaic module comprising:
a plurality of photovoltaic elements including a first photovoltaic element and a second photovoltaic element, the first photovoltaic element and the second photovoltaic element including a plurality of semiconductor layers including a photoelectric conversion layer and a plurality of finger electrodes for collecting generated currents, formed above said semiconductor layers adjacent to a light receiving surface and adjacent to a back surface; and
a tab electrode extending in a first direction for electrically connecting between the first photovoltaic element and the second photovoltaic element, wherein
said tab electrode is electrically connected to said finger electrodes and bonded on said light receiving surface through an insulating bonding material without bus bar electrodes in a region of said first photovoltaic element where the finger electrodes are not formed, said tab electrode is in direct contact with said insulating bonding material, said tab electrode is arranged in a region of a surface of the semiconductor layer on the side of the light receiving surface in which the finger electrodes are formed and a region of the surface of the semiconductor layer on the side of the light receiving surface in which the finger electrodes are not formed, said insulating bonding material bonds the region in which the finger electrodes are not formed and the tab electrode, and said finger electrodes are formed above said semiconductor layers extending in a second direction traversing the tab electrode in plan view to collect generated currents in a region in which said tab electrode is arranged,
each of the plurality of finger electrodes extending in said second direction overlaps the tab electrode extending in said first direction in plan view, and
said tab electrode is electrically connected to said finger electrodes and bonded on said back surface through an insulating bonding material without bus bar electrodes in a region of said second photovoltaic element where the finger electrodes are not formed, said tab electrode is in direct contact with said insulating bonding material, said tab electrode is arranged in a region of a surface of the semiconductor layer on the side of the back surface in which the finger electrodes are formed and a region of the surface of the semiconductor layer on the side of the back surface in which the finger electrodes are not formed, said insulating bonding material bonds the region in which the finger electrodes are not formed and the tab electrode, and said finger electrodes are so formed above said semiconductor layer as to collect generated currents in a region in which said tab electrode is arranged; and
a conductive adhesive is formed on a first region where said plurality of finger electrodes overlap the tab electrode,
wherein a portion of said finger electrode arranged at the first region is directly bonded on at least one of the light receiving surface and the back surface opposing respective tab electrode, and
a second region other than said first region of at least one of the light receiving surface and the back surface opposing respective tab electrode is directly bonded on the tab electrode through said insulating bonding material in plan view.

2. The photovoltaic module according to claim 1, wherein
said insulating bonding material is provided in a region corresponding to said power generation region of said photovoltaic element, in which said finger electrodes are not formed.

3. The photovoltaic module according to claim 1, wherein
said finger electrodes are so formed as to extend in a first direction and be spaced from each other at a prescribed interval in a second direction intersecting with said first direction,
said tab electrode is so arranged as to extend in said second direction, and
said insulating bonding material is provided in a region in which said tab electrode is arranged and said finger electrodes are not formed.

4. The photovoltaic module according to claim 3, wherein
said insulating bonding materials are provided in a plurality of regions located between said finger electrodes adjacent in said second direction, in which said tab electrode is arranged.

5. The photovoltaic module according to claim 3, wherein
said plurality of finger electrodes are divided into a plurality of groups each including a prescribed number of said finger electrodes,
said prescribed number of said finger electrodes included in the same said group are so formed that a distance in said second direction between said finger electrodes adjacent in a region in which said tab electrode is arranged is smaller than a distance in said second direction between said finger electrodes adjacent in a region in which said tab electrode is not arranged, and
said insulating bonding materials are provided in a plurality of regions located between said groups adjacent in said second direction, in which said tab electrode is arranged.

6. The photovoltaic module according to claim 3, wherein
said plurality of finger electrodes are divided into a plurality of groups each including a prescribed number of said finger electrodes,
said prescribed number of said finger electrodes included in the same said group are aggregated into one finger electrode of said prescribed number of said finger electrodes in a region in which said tab electrode is arranged, and
said insulating bonding materials are provided in a plurality of regions located in said groups adjacent in said second direction, in which said tab electrode is arranged.

7. The photovoltaic module according to claim 6, wherein
a distance between said aggregated finger electrodes of two of said groups adjacent to each other is larger than a distance between opposed said finger electrodes of two of said groups adjacent to each other.

8. The photovoltaic module according to claim 6, wherein
a width in said second direction of said aggregated finger electrode is substantially equal to a width in said second direction of each of said finger electrodes located in regions in which said tab electrode is not arranged.

9. The photovoltaic module according to claim 6, wherein
a width in said second direction of said aggregated finger electrode located in said region in which said tab electrode is arranged is larger than a width in said second direction of each of said finger electrodes located in regions in which said tab electrode is not arranged.

10. The photovoltaic module according to claim 9, wherein
a width in said second direction of said aggregated finger electrode is smaller than a distance in said second direction between two of said finger electrodes located at outermost positions in said group in a region in which said tab electrode is not arranged.

11. The photovoltaic module according to claim 1, wherein
said tab electrode is electrically connected to said finger electrodes through a solder material.

12. The photovoltaic module according to claim 11, wherein
said solder materials are provided over substantially entire regions in which said finger electrodes and said tab electrode are overlapped in plan view.

13. The photovoltaic module according to claim 11, wherein
said solder material and said insulating bonding material are so provided as to be spaced at a prescribed interval.

14. The photovoltaic module according to claim 11, wherein
said finger electrodes are so formed as to extend in a first direction,
said tab electrode is so arranged as to extend in a second direction intersecting with said first direction, and
said finger electrodes are divided in a region in which said tab electrode is arranged so as not to cross said region in which said tab electrode is arranged.

15. The photovoltaic module according to claim 14, wherein
said insulating bonding material is so provided in said region in which said tab electrode is arranged as to extend continuously along said second direction.

16. The photovoltaic module according to claim 15, wherein
said solder material is provided on portions of side surfaces of said tab electrode and portions of side surfaces of said insulating bonding material, wherein said side surfaces are perpendicular to surfaces where the tab electrode and insulating bonding material are bonded to each other, so as to electrically connect said side of said tab electrode and a divided end of one of the plurality of finger electrodes.

17. The photovoltaic module according to claim 15, wherein
said solder material is provided on portions of both side surfaces of said tab electrode and portions of side surfaces of said insulating bonding material, wherein said side surfaces are perpendicular to surfaces where the tab electrode and insulating bonding material are bonded to each other, so as to electrically connect both side surfaces of said tab electrode and both divided ends of one of the plurality of finger electrodes.

18. The photovoltaic module according to claim 1, wherein
said photovoltaic element includes a translucent conductive film formed closer to said light receiving surface than said semiconductor layer, and
said tab electrode is bonded to said translucent conductive film through said insulating bonding material.

19. A photovoltaic module comprising:
a plurality of photovoltaic elements including a first photovoltaic element and a second photovoltaic element; and a tab electrode extending in a first direction for electrically connecting between the first photovoltaic element and a second photovoltaic element, wherein each of said plurality of photovoltaic elements has a photoelectric conversion body and a plurality of finger electrodes extending in a second direction traversing the tab electrode in plan view formed above said semiconductor layers adjacent to a light receiving surface and adjacent to a back surface; and formed on a surface of said photoelectric conversion body on a light receiving side and a back side of the photoelectric conversion body, said tab electrode is arranged over a region of the surface of said photoelectric conversion body in which said finger electrodes are formed and a region of the surface of said photoelectric conversion body in which said finger electrodes are not formed, said tab electrode is electrically connected to said finger electrodes and bonded by a bonding material consisting of resin without bus bar electrodes on said region of the surface of said photoelectric conversion body in which said finger electrodes are not formed, said tab electrode is electrically connected to said finger electrodes and bonded on said back side through an insulating bonding material without bus bar electrodes in a region of said second photovoltaic element where the finger electrodes are not formed, said tab electrodes are in direct contact with said insulating bonding material, said tab electrode is arranged in a region of a surface of the photoelectric conversion body on the back side in which the finger electrodes are formed and a region of the surface of the photoelectric conversion body on the back side in which the finger electrodes are not formed, said insulating bonding material bonds the region in which the finger electrodes are not formed and the tab electrode, each of the plurality of finger electrodes extending in said second direction intersects the tab electrode extending in said first direction in plan view, and are so formed on said photoelectric conversion body as to collect generated currents in a region in which said tab electrode is arranged; and a conductive adhesive is formed on a first region where said plurality of finger electrodes traverse the tab electrode, wherein a portion of said finger electrodes arranged at the first region is directly bonded on at least one of the light receiving surface and the back surface opposing respective tab electrode, and a second region other than said first region of at least one of the light receiving surface and the back surface opposing respective tab electrode is directly bonded on the tab electrode through said insulating bonding material in plan view.

20. the photovoltaic module according to claim 19, wherein said tab electrode is bonded by said bonding material consisting of resin to said region of the surface of said photoelectric conversion body in which said finger electrodes are not formed, between said finger electrodes adjacent to each other.

21. The photovoltaic module according to claim 19, wherein said tab electrode is electrically connected to said finger electrodes through a solder material.

22. The photovoltaic module according to claim 19, wherein said tab electrode is in direct contact with said finger electrodes.

23. The photovoltaic module according to claim 1, wherein each of said plurality of finger electrodes has a single line shape in plan view.

24. The photovoltaic module according to claim 1, wherein the plurality of finger electrodes extend in the second direction overlapping the tab electrode and each of the plurality of finger electrodes overlaps the tab electrode in plan view, the conductive adhesive is formed on a first region where said plurality of finger electrodes overlap the tab electrode, each of the first region is in direct contact with the light receiving surface and the back surface opposing respective tab electrode, and each of the second region other than said first region in the light receiving surface and the back surface opposing respective tab electrode is directly bonded on the tab electrode through said insulating bonding material in plan view.

25. A photovoltaic module comprising:

a plurality of photovoltaic elements including a first photovoltaic element and a second photovoltaic element, the first photovoltaic element and the second photovoltaic element including a plurality of semiconductor layers including a photoelectric conversion layer and a plurality of finger electrodes for collecting generated currents, formed on said semiconductor layers adjacent to a light receiving surface and adjacent to a back surface; and a tab electrode extending in a first direction for electrically connecting between the first photovoltaic element and the second photovoltaic element, wherein said tab electrode is electrically connected to said finger electrodes and bonded on said light receiving surface through an insulating bonding material without bus bar electrodes in a region of said first photovoltaic element where the finger electrodes are not formed, said tab electrode is in direct contact with said insulating bonding material, said tab electrode is arranged in a region of a surface of the semiconductor layer on the side of the light receiving surface in which the finger electrodes are formed and a region of the surface of the semiconductor layer on the side of the light receiving surface in which the finger electrodes are not formed, said insulating bonding material bonds the region in which the finger electrodes are not formed and the tab electrode, and said finger electrodes are formed on said semiconductor layers extending in a second direction traversing the tab electrode in plan view to collect generated currents in a region in which said tab electrode is arranged, each of the plurality of finger electrodes extending in said second direction overlaps the tab electrode extending in said first direction in plan view, and said tab electrode is electrically connected to said finger electrodes and bonded on said back surface through an insulating bonding material without bus bar electrodes in a region of said second photovoltaic element where the finger electrodes are not formed, said tab electrode is in direct contact with said insulating bonding material, said tab electrode is arranged in a region of a surface of the semiconductor layer on the side of the back surface in which the finger electrodes are formed and a region of the surface of the semiconductor layer on the side of the back surface in which the finger electrodes are not formed, said insulating bonding material bonds the region in which the finger electrodes are not formed and the tab electrode, and said finger electrodes are so formed on said semiconductor layer as to collect generated currents in a region in which said tab electrode is arranged; and a conductive adhesive is formed on a first region where said plurality of finger electrodes overlap the tab electrode, wherein a portion of said finger electrode is arranged at the first region is directly bonded on at least one of the light receiving surface and the back surface opposing respective tab electrode, and a second region other than said first region of at least one of the light receiving surface and the back surface opposing respective tab electrode is directly bonded on the tab electrode through said insulating bonding material in plan view.

26. The photovoltaic module according to claim 1, wherein each of the plurality of finger electrodes intersects the tab electrode in plan view.

27. The photovoltaic module according to claim 25, wherein each of the plurality of finger electrodes intersects the tab electrode in plan view.

28. The photovoltaic module according to claim 19, wherein the plurality of finger electrodes are formed on said semiconductor layers adjacent to the light receiving surface and adjacent to the back surface.

29. The photovoltaic module according to claim 3, wherein said plurality of finger electrodes are divided into a plurality of groups each including a prescribed number of said finger electrodes, said prescribed number of said finger electrodes included in the same said group are so formed that a distance in said second direction between said finger electrodes adjacent in a region in which said tab electrode is arranged is smaller than a distance in said second direction between said finger electrodes adjacent in a region in which said tab electrode is not arranged.

* * * * *